US008828493B2

(12) United States Patent
Cheng et al.

(10) Patent No.: US 8,828,493 B2
(45) Date of Patent: Sep. 9, 2014

(54) METHODS OF DIRECTED SELF-ASSEMBLY AND LAYERED STRUCTURES FORMED THEREFROM

(75) Inventors: Joy Cheng, San Jose, CA (US); William D. Hinsberg, Fremont, CA (US); Charles Thomas Rettner, San Jose, CA (US); Daniel Paul Sanders, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 491 days.

(21) Appl. No.: 12/641,987

(22) Filed: Dec. 18, 2009

(65) Prior Publication Data
US 2011/0147985 A1 Jun. 23, 2011

(51) Int. Cl.
| | | |
|---|---|---|
| B32B 3/10 | (2006.01) | |
| G03F 7/16 | (2006.01) | |
| G03F 7/30 | (2006.01) | |
| G03F 7/38 | (2006.01) | |
| G03F 7/40 | (2006.01) | |
| G03F 7/20 | (2006.01) | |
| G03F 7/039 | (2006.01) | |
| G03F 7/09 | (2006.01) | |

(52) U.S. Cl.
CPC ............ *G03F 7/0392* (2013.01); *G03F 7/2041* (2013.01); *G03F 7/165* (2013.01); *G03F 7/091* (2013.01); *G03F 7/40* (2013.01)
USPC ............ 427/259; 427/258; 427/261; 427/264; 427/270; 427/271; 427/272; 427/282; 430/322; 430/323; 430/324; 430/325; 430/326; 430/327; 430/328; 430/329; 430/330

(58) Field of Classification Search
None
See application file for complete search history.

(56) References Cited

U.S. PATENT DOCUMENTS

| | | | |
|---|---|---|---|
| 6,746,825 | B2 | 6/2004 | Nealey et al. |
| 6,900,001 | B2 | 5/2005 | Livesay et al. |
| 6,926,953 | B2 | 8/2005 | Nealey et al. |
| 7,008,757 | B2 | 3/2006 | Reichmanis et al. |
| 7,347,953 | B2 | 3/2008 | Black et al. |
| 7,521,090 | B1 | 4/2009 | Cheng et al. |

(Continued)

FOREIGN PATENT DOCUMENTS

JP 2001343757 12/2001

OTHER PUBLICATIONS

Mansky et al., "Controlling Polymer-Surface Interactions with Random Copolymer Brushes", Science, vol. 275, (Mar. 7, 1997), pp. 1458-1460.*
Jeong et al., "Soft Graphoepitaxy of Block Copolymer Assembly with Disposable Photoresist Confinement", Nano Letters, vol. 9 No. 6, (May 7, 2009), pp. 2300-2305.*

(Continued)

*Primary Examiner* — Michael Cleveland
*Assistant Examiner* — Lisha Jiang
(74) *Attorney, Agent, or Firm* — Michael R. Roberts

(57) ABSTRACT

Methods are disclosed for forming a layered structure comprising a self-assembled material. An initial patterned photoresist layer is treated photochemically, thermally, and/or chemically to form a treated patterned photoresist layer comprising a non-crosslinked treated photoresist. The treated photoresist is insoluble in an organic solvent suitable for casting a material capable of self-assembly. A solution comprising the material capable of self-assembly dissolved in the organic solvent is casted on the treated layer, and the organic solvent is removed. The casted material is allowed to self-assemble with optional heating and/or annealing, thereby forming the layered structure comprising the self-assembled material. The treated photoresist can be removed using an aqueous base and/or a second organic solvent.

24 Claims, 14 Drawing Sheets

(56) References Cited

U.S. PATENT DOCUMENTS

| | | | |
|---|---|---|---|
| 7,521,094 | B1 | 4/2009 | Cheng et al. |
| 2002/0128408 | A1* | 9/2002 | Goodall et al. ............... 526/171 |
| 2003/0022111 | A1* | 1/2003 | Falk et al. .................... 430/322 |
| 2003/0091752 | A1 | 5/2003 | Nealey et al. |
| 2004/0029047 | A1 | 2/2004 | Ishibashi et al. |
| 2004/0175628 | A1 | 9/2004 | Nealey et al. |
| 2005/0158988 | A1 | 7/2005 | Lee et al. |
| 2005/0227492 | A1 | 10/2005 | Hah et al. |
| 2006/0121076 | A1* | 6/2006 | Ranade et al. ............... 424/422 |
| 2006/0134556 | A1 | 6/2006 | Nealey et al. |
| 2007/0134420 | A1 | 6/2007 | Koberstein et al. |
| 2007/0134939 | A1* | 6/2007 | Brueck et al. ................. 438/778 |
| 2008/0070010 | A1 | 3/2008 | Dravid et al. |
| 2008/0085601 | A1 | 4/2008 | Park et al. |
| 2008/0193658 | A1 | 8/2008 | Millward |
| 2008/0199814 | A1 | 8/2008 | Brzozowy et al. |
| 2008/0315270 | A1* | 12/2008 | Marsh et al. .................. 257/292 |
| 2009/0035668 | A1 | 2/2009 | Breyta et al. |
| 2009/0239086 | A1* | 9/2009 | Ishizuka et al. ............... 428/447 |
| 2010/0167214 | A1* | 7/2010 | Yoon et al. .................... 430/323 |
| 2011/0052883 | A1* | 3/2011 | Jain et al. .................. 428/195.1 |

OTHER PUBLICATIONS

"Nanostructure engineering by templated self-assembly of block copolymers" J.Y. Cheng; A.M. Mayes; Caroline A. Ross, Nature Materials, Nov. 2004, vol. 3, pp. 823-828, Oct. 3, 2004.

"Polymer self assembly in simiconductor microelectronics" Black et al., IBM J. Res. Dev., Sep. 2007, vol. 51, pp. 605-633.

"Block copolymers and conventional lithography" M.P. Stoykovich; P.F. Nealey, Materials Today, Sep. 2006, vol. 9, pp. 20-29.

"Directed Self-Assembly of Block Copolymers for Nanolithography: Fabrication of Isolated Features and Essential Integrated Circuit Geometries" M.P. Stoykovich et al., ACS Nano, vol. 1, No. 3, pp. 168-175, (2007).

"Templated Self-Assembly of Block Copolymers: Top-Down Helps Bottom-Up" J.Y. Cheng; C.A. Ross; H.I Smith; E.L. Thomas, Adv. Materials, 2006, 18, pp. 2505-2521.

"Patterned Magnetic Media Made by Self-Assembled Block-Copolymer Lithography" C.A. Ross; J.Y. Cheng, MRS Bull., Sep. 2008, vol. 33, pp. 838-845.

"Surface patterns from block copolymer self-assembly" H.C. Kim; W.D. Hinsberg, J. Vac. Sci. Technol. A, Nov./Dec. 2008, 26, pp. 1369-1382.

\* cited by examiner

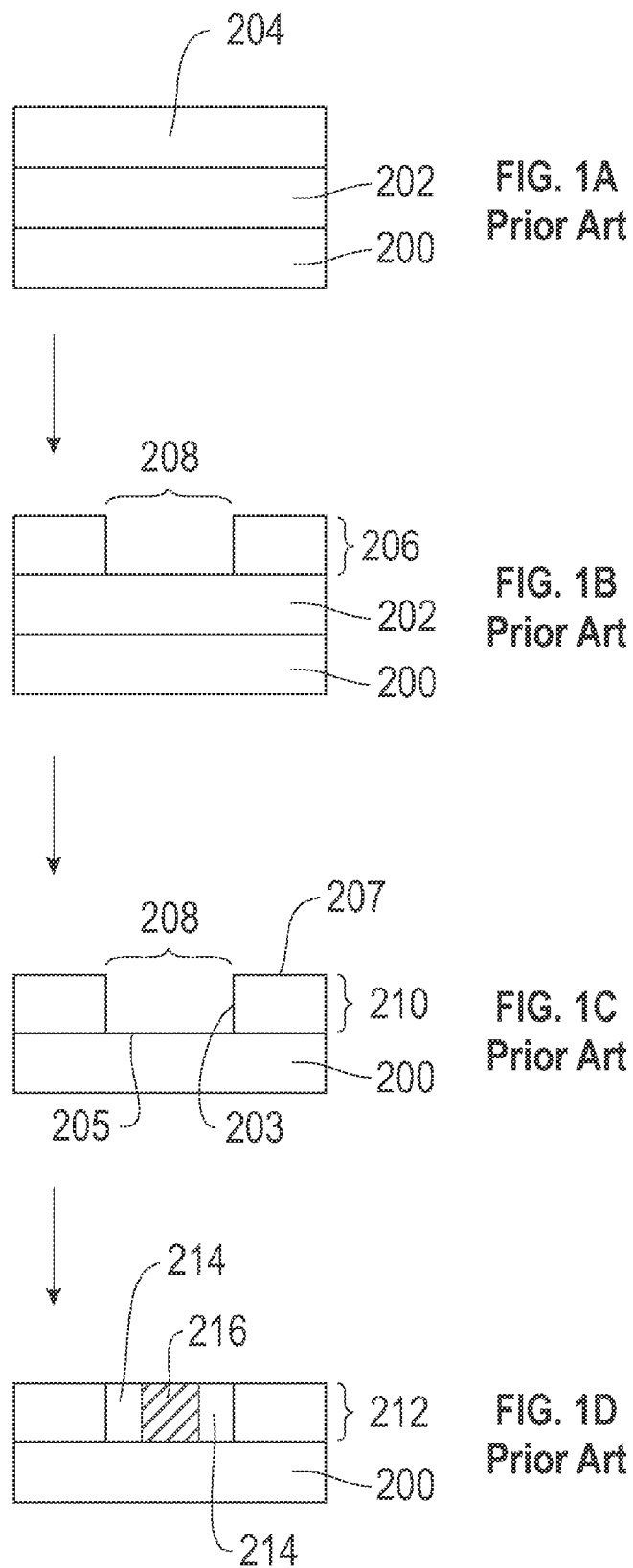

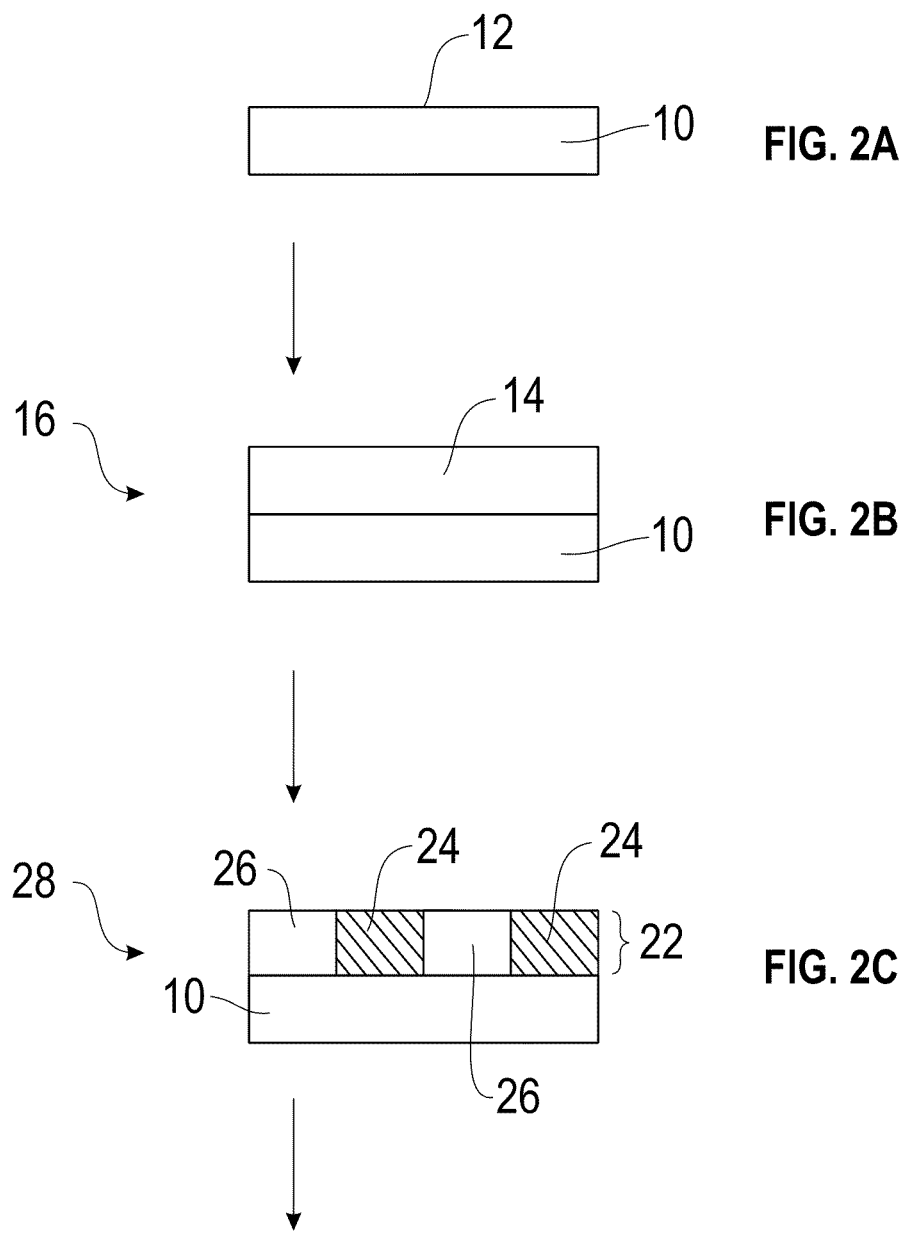

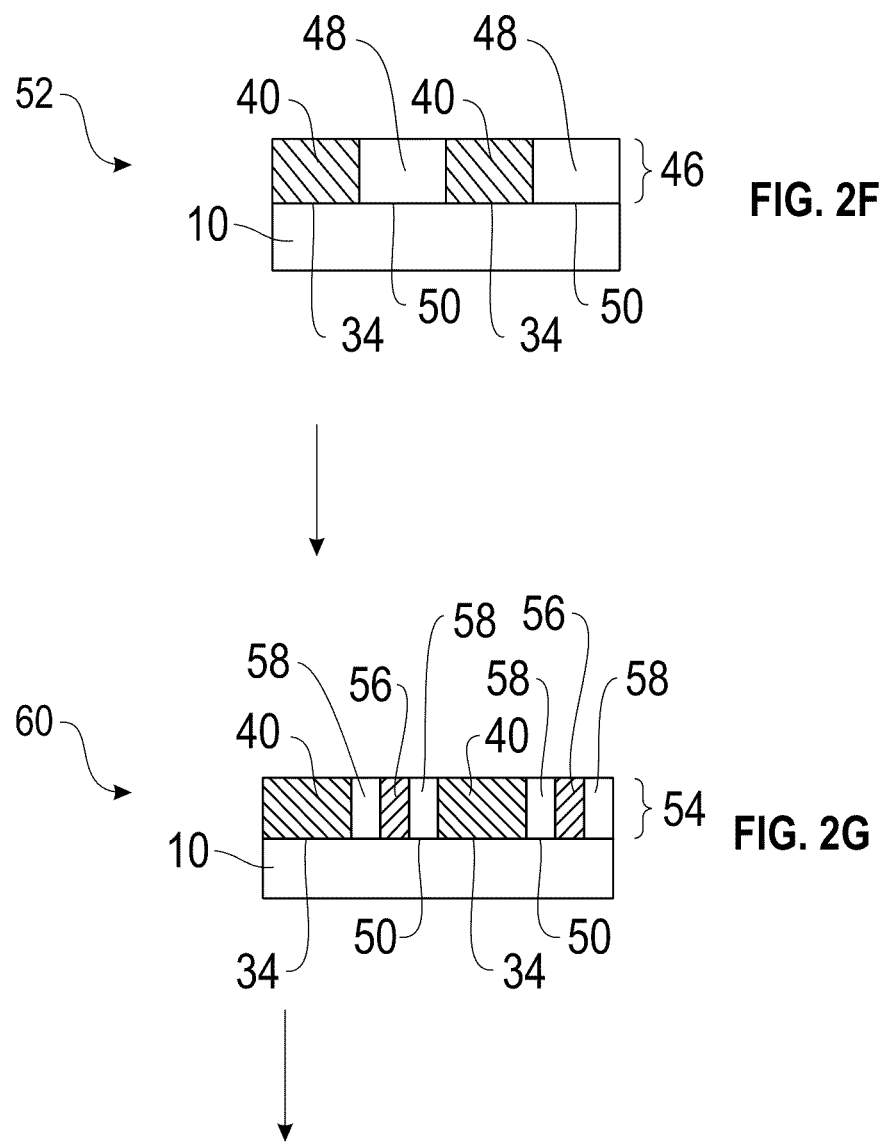

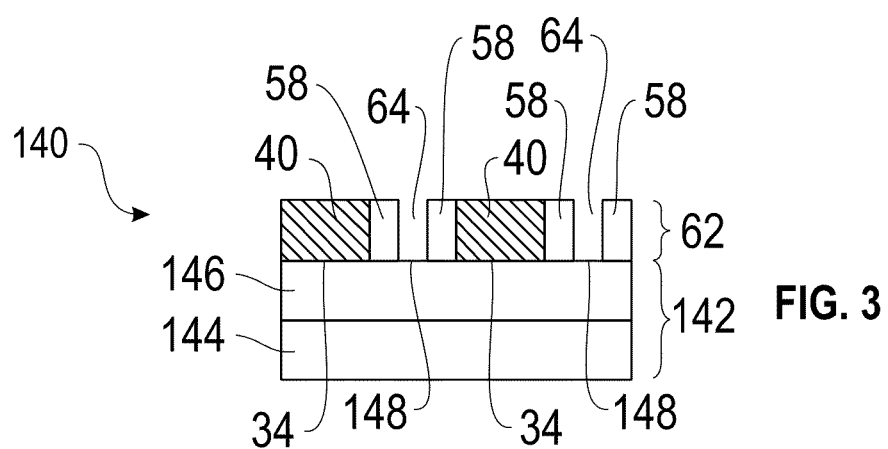

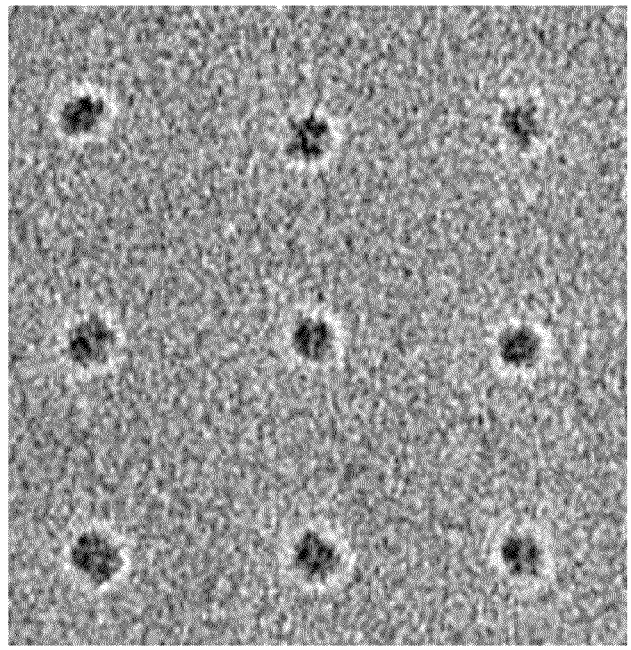
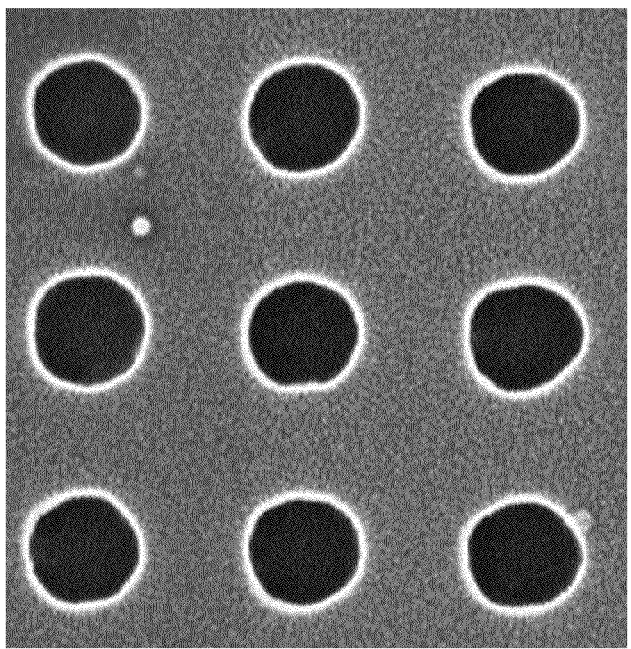
FIG. 6B
FIG. 6A

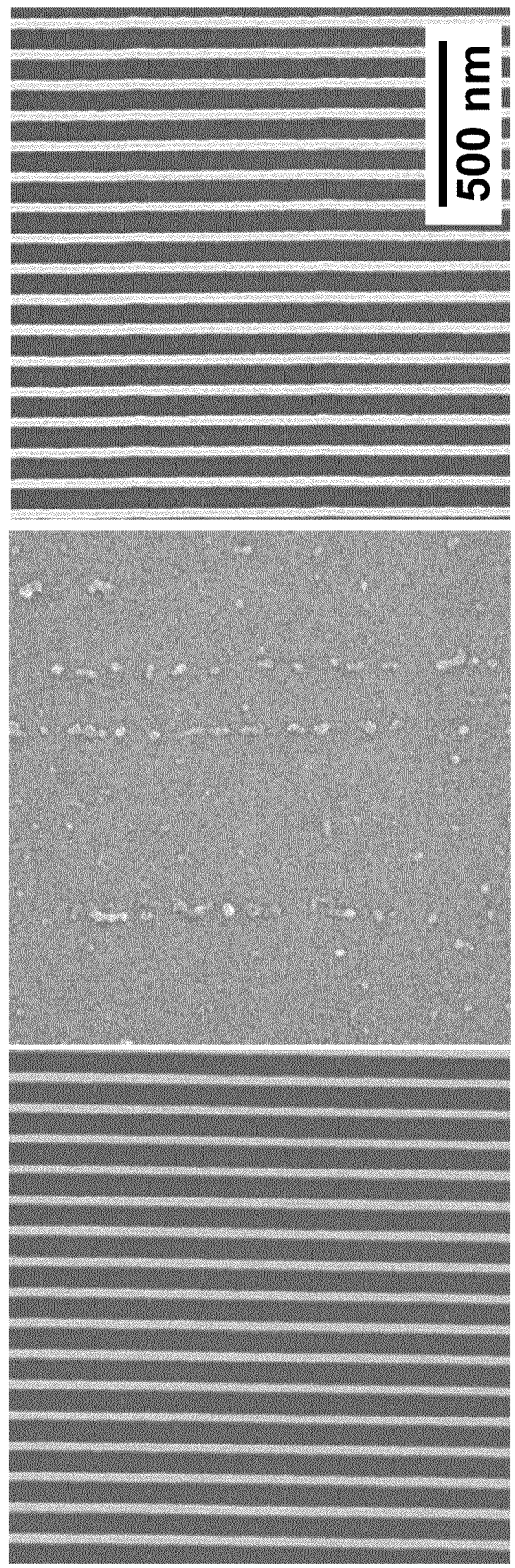

METHODS OF DIRECTED SELF-ASSEMBLY AND LAYERED STRUCTURES FORMED THEREFROM

BACKGROUND

This disclosure is related to methods of directed self-assembly to form layered structures, and more specifically, to the use of photoresists for directed polymer self-assembly.

Patterning features with smaller critical dimensions allows denser circuitry to be created and therefore can reduce overall production cost. Tighter pitch and smaller critical dimensions are needed for each technology node. Directed polymer self-assembly (DSA) is a potential candidate to extend current lithography by enhancing the spatial resolution of a pre-defined pattern on the substrate. A graphoepitaxial technique, where the polymer self-assembly is guided by lithographically pre-patterned substrates with topographical features and their surface properties, is one method for implementing DSA. One of the major obstacles impeding integration of graphoepitaxy into standard 193 nm optical lithographic processes is the compatibility of the pre-patterned 193 nm positive photoresist substrate with the organic casting solvent used to apply the self-assembly (SA) polymer solution. Graphoepitaxial pre-patterns are typically generated in a hard mask layer (for example, silicon oxide) to prevent the organic solvent used in casting the self-assembly material (SA material) from dissolving the pre-pattern. The use of hard mask pre-patterns adds process complexity, as shown in the series of steps in FIG. 1A to 1D (Prior Art) using schematic layer diagrams. First, a hard mask layer 202 is deposited on a bottom layer 200 (e.g., silicon wafer or transfer layer), followed by a photoresist layer 204 (FIG. 1A). Patterning the photoresist layer in a lithographic process produces a patterned photoresist layer 206 (FIG. 1B). If the hard mask layer 202 does not also serve as an anti-reflective coating (ARC), a separate ARC layer can be applied to the substrate prior to the photoresist. The image of the patterned photoresist layer 206 comprising trench area 208 is then transferred into the hard mask layer 202 by an additive or subtractive process, after which the photoresist is stripped, leaving a hard mask pre-pattern 210 (FIG. 1C) for self-assembly. Hard mask pre-pattern 210 includes all surfaces (e.g., surfaces 203, 205, and 207 in FIG. 1C) formed or uncovered by etching the hard mask layer and removing the photoresist pattern. If desired, the surface of the hard mask pre-pattern 210 can be further modified prior to applying a material capable of self-assembly. For example, a polymer can be chemically grafted onto the surface to provide the appropriate surface properties for the subsequent self-assembly process. A SA material is then cast from an organic solvent onto the hard mask pre-pattern 210 to form layer 212, in this case allocating the SA material substantially in trench 208. The hard mask pre-pattern topographically directs the self-assembly of the SA material, forming ordered domains 214 and 216 in the trench areas 208 (FIG. 1D). Finally, the hard mask layer must be removed, typically adding another process step. The resulting structure is also difficult to rework. The additional steps needed to generate a hard mask pattern and, optionally, modify its surface properties increases the cost of the DSA process, and further increases process complexity.

Alternatively, a crosslinking negative-tone photoresist that after exposure does not dissolve in the organic casting solvent for the SA material can be used to guide self-assembly of polymers. Unfortunately, negative-tone photoresists that rely on a cross-linking mechanism often suffer from poor profiles, microbridging, and swelling caused by organic solvents. These crosslinked negative-tone resists are difficult to remove if the wafer needs to be reworked. In addition, for specific patterns such as contact holes and vias, positive-tone imaging is preferred. As a result, positive-tone resists are the mainstream resists for high resolution 193 nm patterning and, therefore, most photomasks are designed for positive-tone imaging.

The pre-patterns formed using standard 193 nm positive-tone resists following exposure and aqueous base development are soluble in many organic solvents. This limits their application in DSA due to their incompatibility with the organic solvents used to apply a material capable of self-assembly; that is, the organic solvents can dissolve the pre-pattern. Conventionally, organic solvent compatibility can be achieved by a "freezing" or "hardening" process that creates a non-soluble layer or crust at the photoresist surface. Typically, this can be achieved by a number of processes including crosslinking by damaging radiation (e.g., 172 nm radiation), reaction with a freezing material, or by a surface curing agent that crosslinks the surface of the photoresist. The frozen or hardened positive photoresist is insoluble in the SA organic solvent, but is more difficult to rework. A freezing material or surface curing agent can react with not only the photoresist material, but also with the non-covered substrate surface (e.g., ARC layer or hard mask). In the case where one desires to use chemical differences between the underlying surface and the photoresist sidewall to direct self-assembly, this non-selective reaction is disadvantageous. The freezed photoresist may reflow when baking at a high temperature which may be required to reduce the DSA process time. In addition, the use of a freezing material or surface curing agent imposes significant additional materials and process costs.

Therefore, methods that will circumvent the organic solvent incompatibility without crosslinking the photoresist is highly desirable for integration of DSA into standard lithography.

SUMMARY

In an embodiment, a method is disclosed for forming a layered structure comprising a self-assembled material, the method comprising:

disposing a photoresist layer comprising a non-crosslinking, positive-tone photoresist on a surface of a substrate; optionally baking the photoresist layer; pattern-wise exposing the photoresist layer to first radiation; optionally baking the exposed photoresist layer; developing the exposed photoresist layer with an aqueous alkaline developer to form an initial patterned photoresist layer;

treating the initial patterned photoresist layer photochemically, thermally, and/or chemically to form a treated patterned photoresist layer comprising non-crosslinked treated photoresist, wherein the treated photoresist is insoluble in a given organic solvent suitable for casting a given material capable of self-assembly, and the treated photoresist is soluble in the aqueous alkaline developer and/or a second organic solvent;

casting a solution comprising the given material capable of self-assembly dissolved in the given organic solvent on the treated patterned photoresist layer, and removing the given organic solvent; and allowing the casted given material to self-assemble while optionally heating and/or annealing the casted material, thereby forming the layered structure comprising the self-assembled material.

In another embodiment, a method is disclosed for forming a layered structure comprising a relief pattern derived from a self-assembled material, the method comprising:

disposing a photoresist layer comprising a non-crosslinking, positive-tone photoresist capable of chemical amplification on a surface of a substrate; pattern-wise exposing the photoresist layer to first radiation and optionally baking the exposed photoresist layer; developing the exposed photoresist layer with an aqueous alkaline developer to form an initial patterned photoresist layer;

flood exposing the initial patterned photoresist layer to second radiation at a dose of 1 to 200 mJ/cm$^2$, and heating the flood exposed initial patterned photoresist layer at 80° C. to 250° C. for at least 1 sec to form a treated patterned photoresist layer comprising non-crosslinked treated photoresist, wherein the treated photoresist is insoluble in a given organic solvent suitable for casting a given material capable of self-assembly, and the treated photoresist is soluble in the aqueous alkaline developer and/or a second organic solvent;

casting a solution comprising the given material capable of self-assembly dissolved in the given organic solvent on the treated patterned photoresist layer, and removing the given organic solvent;

allowing the casted given material to self-assemble while optionally heating and/or annealing the casted given material, thereby forming a domain pattern comprising the self-assembled given material; and selectively removing a first domain of the domain pattern, while leaving behind a second domain of the domain pattern, thereby forming the layered structure comprising the relief pattern.

In another embodiment, a method is disclosed for forming a layered structure from a self-assembled polymer, comprising:

forming a layer of a positive-tone photoresist on a substrate that includes a surface suitable for self-assembly of a polymer, the photoresist capable of chemical amplification; pattern-wise exposing the photoresist; optionally baking the exposed photoresist; developing the exposed photoresist in an aqueous alkaline developer to form an initial patterned photoresist layer;

generating polar groups in the initial patterned photoresist layer and increasing the initial patterned photoresist layer polarity, thereby rendering the initial patterned photoresist layer insoluble in a given casting solvent suitable for a given self-assembling polymer, forming a treated photoresist layer;

optionally, further thermally or chemically treating the treated photoresist layer;

applying a layer of a self-assembling polymer dissolved in the given casting solvent over the treated photoresist layer, and allowing the self-assembling polymer to self-assemble;

optionally, annealing the layer of self-assembling polymer;

selectively removing a specific self-assembled domain of the self-assembled polymer, thereby forming a relief pattern;

selectively removing the treated photoresist layer using a stripper and/or plasma; and optionally, transferring the relief pattern to the substrate.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

In the drawings, like elements are numbered alike.

FIGS. 1A to 1D are schematic layer diagrams showing a method by which graphoepitaxy is typically implemented using a hard mask (Prior Art).

FIGS. 2A to 2I are schematic layer diagrams showing an example of how a disclosed method topographically directs self-assembly using a positive-tone photoresist.

FIG. 3 is a schematic layer diagram corresponding to FIG. 2H, having a two-layer substrate rather than a one-layer substrate.

FIG. 6A is a scanning electron microscopy (SEM) image of the vias in the treated patterned photoresist layer of Example 3, before applying a polymer blend.

FIG. 6B is a scanning electron microscopy (SEM) image of the vias of Example 3 after applying the polymer blend, allowing the polymer blend to self-assemble, and selectively etching the PMMA domains, leaving the PS domains.

FIG. 7A is an SEM image of the treated patterned photoresist layer of Example 4.

FIG. 7B is an SEM image of the treated patterned photoresist layer of Example 4, after baking the treated patterned photoresist layer at 170° C. for 1 minute, and then rinsing with PGMEA.

FIG. 7C is an SEM image of the treated patterned photoresist layer of Example 4, after baking the treated patterned photoresist layer at 170° C. for 5 minutes, and then rinsing with PGMEA.

DETAILED DESCRIPTION

Figure 2D:
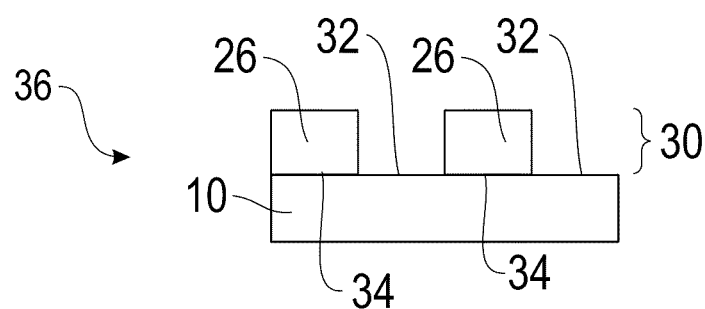

The methods described herein for directing self-assembly of a given SA material (e.g., a block copolymer or polymer blend) utilize a non-crosslinking, positive-tone photoresist and positive-tone development with aqueous alkaline developer to form an initial patterned photoresist layer (also referred to as "initial layer") on a substrate. The photoresist can also be capable of chemical amplification. The initial layer, which comprises non-crosslinked, non-exposed photoresist (referred to as "pre-treated photoresist") can be dissolved in a given organic casting solvent for the given SA material. The initial layer is therefore subjected to a polarity switching treatment to form a treated patterned photoresist layer (also referred to as the "treated layer") comprising non-crosslinked, treated photoresist. The treated photoresist is insoluble in the given organic casting solvent for the given SA material. The treatment increases the concentration of polar functional groups within the treated layer (i.e., throughout the thickness of the treated layer, not just the surface) without irreversibly crosslinking the treated photoresist. The treatment can be photochemical, thermal, chemical, or a combination of thereof. The treated layer and the substrate surfaces uncovered during development provide a graphoepitaxial pre-pattern for self-assembly of the given SA material. The methods advantageously utilize standard exposure and development conditions to generate the initial layer. Further, the treated photoresist can be easily removed before or after self-assembly using a standard aqueous alkaline developer, photoresist stripper, and/or a suitable polar second organic solvent (e.g., propylene carbonate or gamma-butyrolactone).

The surface properties essential for controlling DSA can be present in the treated photoresist and/or the substrate surface. If present in both, then the surfaces of the treated photoresist (e.g., the sidewalls and mesas) and the substrate surface should have appropriate affinities for the various domains of the self-assembled material required to support the desired morphology and orientation (e.g., perpendicular or parallel to the sidewalls) of the self-assembled material. More typically, the substrate surface does not retain the necessary surface properties due to chemical surface damage caused by exposure, development and/or the treatment. As a result, the method is not generally suitable for preparing a chemical pre-pattern for directing self-assembly by chemical epitaxy.

A "pre-pattern" is a specific term used herein referring to the collection of surfaces contacted by the casting solution of the SA material. One or more of the surfaces directs self-assembly. The pre-pattern herein includes the surfaces and topography of the treated patterned photoresist layer and the substrate surfaces uncovered by development. The SA material can be disposed on all or some of these surfaces.

A "graphoepitaxial pre-pattern" is a pre-pattern in which topography and surface properties influence self-assembly. A "chemical pre-pattern" is a pre-pattern in which self-assembly is predominantly influenced by surface properties. No sharp dimensional limits exist between these two pre-pattern categories because the extent of topographical influence on self-assembly is also dependent on the thickness of the SA layer in relation to the underlying relief surface. In general, however, when graphoepitaxial pre-patterns are used, the thickness of the SA layer is less than or equal to the trench height of the underlying pre-pattern. For chemical pre-patterns, the SA thickness is greater than any trench height of the underlying topography. Herein, the pre-patterns are graphoepitaxial.

As indicated above, a material capable of self-assembling into compositionally different, phase-separated domains is referred to as a SA material. The term "substrate" refers to all underlying layers of a structure on which the photoresist layer is disposed. The substrate can have one or more layers arranged in a stack. In a multi-layered substrate, the layer directly below and in contact with the photoresist layer is the top-most layer of the substrate, also referred to as "the underlayer" to the photoresist layer. The terms "surface" or "underlying surface" refer, unless otherwise stated, to the surface of the substrate on which the photoresist layer is disposed. As non-limiting examples, the photoresist layer can be disposed on the surface of a silicon wafer or a metal foil, or more particularly on the surface of an anti-reflection layer (ARC) of a multi-layer substrate, where the ARC layer is the top-most layer. In this example, the ARC layer is also the underlayer of the photoresist layer. In another example, the ARC layer has a polymer brush layer attached to the top surface. In this instance, the polymer brush layer is also the underlayer of the photoresist layer.

The term "disposed" refers to a layer in contact with a surface of another layer. "Disposing" or "applying" refer to forming a layer to be in contact with a surface of another layer, without limitation as to the method employed unless otherwise stated, with the proviso that the desirable characteristics of the disposed or applied layer are obtained, such as uniformity and thickness. The term "casting" refers to forming a layer of a material by disposing on a substrate a solution of the material dissolved in a solvent, and removing the solvent. Unless otherwise stated, copolymers are random copolymers, indicated by "-co-", or "-r-" in the name. Block copolymers are indicated by "-b-" or "-block-" in the name. Alternating block copolymers are indicated by "-alt-" in the name.

The term "chemical amplification" is well known in the art of photoresists, and refers to the catalytic reaction of functional groups of the photoresist as catalyzed by a photogenerated species. The fundamentals of chemical amplification and its application to photoresist chemistry is reviewed by Ito in "Chemical Amplification Resists for Microlithography" *Adv. Polym. Sci.*, vol. 172, pages 37-245 (2005). The most common chemically-amplified photoresists utilize photoacid generators (PAGs) and the most commonly employed reaction mechanism is the acid-catalyzed deprotection of protected polar functional groups. For example, acid-sensitive esters can be catalytically converted to more polar carboxylic acid groups by a photo-released acid. Chemical amplification typically occurs during a post-exposure bake, when one photo-generated acid molecule catalyzes the deprotection of many ester groups in the exposed areas. The resulting deprotected photoresist has increased polarity compared to an as-exposed photoresist or the non-exposed photoresist.

Herein, a "positive-tone photoresist" is a photoresist that becomes more soluble in an aqueous alkaline developer when exposed to radiation. The positive-tone photoresist does not crosslink when it is exposed, developed, or when optionally baked before or after development. A "negative-tone photoresist" becomes less soluble in an aqueous alkaline developer when exposed, typically due to a photo-induced crosslinking mechanism.

The terms "does not crosslink" and "non-crosslinking" refer to the mechanism by which the photoresist switches solubility with respect to the specified developing solution. In the method described herein, the photoresist operates primarily by a non-crosslinking mechanism. It should be understood that some crosslinking or coupling reactions may advantageously occur in the exposed regions of the photoresist during the exposure or post-exposure bake processes; however, these reactions should not occur to a level sufficient to irreversibly render the exposed photoresist material insoluble in both tetramethylammonium hydroxide photoresist developer and organic photoresist stripping solvents (e.g., propylene carbonate or gamma-butyrolactone). For example, some carboxylic acid anhydride linkages may be formed during baking at elevated temperatures in the presence of a strong photogenerated acid; however, these linkages may be cleaved by tetramethylammonium hydroxide developer and would not prevent the patterned photoresist from being stripped.

"Negative-tone development" means the non-exposed areas of the photoresist layer are removed during development. "Positive-tone development" means the exposed areas of the photoresist layer are removed during development.

It is understood that in some cases (e.g., when forming dense, high resolution patterns) all of the photoresist layer can receive some dose of radiation exposure. By "non-exposed photoresist" is meant the portion of the photoresist layer that has received insufficient dose to switch the solubility of the photoresist, either before or after an optional bake, in a given developer compared to the pre-exposed photoresist. An "exposed photoresist" has received sufficient exposure to switch the solubility of the photoresist, either before or after an optional bake, in a given developer compared to the pre-exposed photoresist.

Casting a solution of SA material on a photoresist layer (e.g., the treated layer), is understood to mean the solution makes contact with the surfaces of the photoresist features as well as the substrate surfaces uncovered by development. When referring to the chemical components, reactivity, solubility and/or surface properties of the initial layer or the treated layer, it is understood that such reference is directed only to the photoresist material and not to the substrate or the substrate surface, unless otherwise stated. Likewise, when referring to the chemical components, chemical reactivity, solubility and/or surface properties of the substrate surface or substrate layers, such reference is directed only to the substrate surface or substrate layer and not to the photoresist material, unless otherwise stated.

For clarity, it is also understood that the initial layer comprises pre-treated photoresist and the treated layer comprises treated photoresist.

A polarity change herein implies an altered chemical composition that affects relative solubility without crosslinking. Subjecting the initial patterned photoresist layer to a post-development thermal, photochemical, and/or chemical treatment renders the treated photoresist less soluble in an organic casting solvent for the SA material compared to the pre-treated photoresist. In one example, the treated photoresist has increased polarity compared to the pre-treated photoresist. The extent of the polarity change can be measured by comparing the solubility of the treated and pre-treated photoresist in the organic casting solvent for the SA material. The increased polarity renders substantially all of treated photoresist, not just the surface of the treated photoresist layer, insoluble in the organic casting solvent for the SA material.

Increased polarity can be achieved, for example, by deprotection of protected polar functional groups. Polar functional groups include carboxylic acid groups, phenols, higher aromatic alcohols, and alcohols. A number of processes exist for deprotecting protected polar functional groups in the initial layer. For example, a second exposure (e.g., a whole area exposure, also termed flood exposure) of the initial layer with second radiation can generate a strong acid from photoacid generator (PAG). During a subsequent post-exposure bake, the photo-released acid can then, for example, catalyze the deprotection of acid-sensitive tertiary carboxylic ester groups in the initial layer. Another method of deprotection involves direct thermolysis of protecting groups at elevated temperature. Alternatively, thermolysis of a thermal acid generator or a photoacid generator can create strong acid molecules that can catalyze the acidolysis of protecting groups. A large number of suitable acid-labile or temperature-labile protecting groups for polar functional groups such as carboxylic acids and phenols are described in Wuts, P. G. M. and Greene, T. W. *Greene's Protective Groups in Organic Synthesis*, $4^{th}$ ed. John Wiley & Sons; Hoboken, N.J., 2007. and Kocienski, P. J. *Protecting Groups*, $3^{rd}$ ed. Georg Thieme Verlag: Stuttgart, Germany, 2005. In particular, the protecting groups include tertiary esters, orthoesters, acetals, ketals, carbonates, silyl ethers and silyl esters.

The extent of deprotection required to render the treated photoresist insoluble in the organic casting solvent used for the SA material will depend upon the photoresist composition and the organic casting solvent, among other factors. Notably, the extent of deprotection need not be 100%. In a positive-tone photoresist that is capable of chemical amplification, the solubility of the exposed and baked photoresist in an aqueous alkaline developer is typically non-linear with respect to the percent deprotection, and can change by orders of magnitude over a relatively small percentage change in deprotection. In fact, it is this non-linear response that rectifies the often diffuse sinusoidal aerial image of the exposed photoresist into the desired sharp square pattern profiles in the developed initial layer. In the present methods, this phenomenon is advantageously used to render the treated photoresist insoluble in a selected organic casting solvent for the SA material. Only a small or moderate extent of deprotection may be required to render the treated photoresist insoluble in a desired organic solvent. Complete deprotection can, in some cases, be undesirable due to unacceptable pattern distortion induced by the loss of such large quantities of protecting groups.

Advantageously, the glass transition temperature ($T_g$) of the treated photoresist may be higher than the $T_g$ of the pre-treated photoresist. A higher glass transition temperature prevents photoresist reflow under additional thermal treatment, which can deform topographical features. Consequently, the deprotection of protected polar groups in the initial layer simplifies the DSA process and provides a wider process window for additional thermal treatment. As an additional benefit, the method provides a simpler route to rework or selectively remove the treated photoresist. For example, the treated photoresist containing deprotected polar groups can be dissolved in an alkaline developer and/or a suitable second organic solvent for rework. Alternatively, the treated photoresist can be selectively removed from at least one domain of the SA material if there is a sufficiently large polarity difference between the treated photoresist and the SA domain.

The method is illustrated in the schematic layered structure diagrams of FIGS. 2A to 2I. Substrate 10 of FIG. 2A has surface 12, on which is disposed a non-crosslinking positive-tone photoresist layer 14 (FIG. 2B, structure 16). Pattern-wise exposure of photoresist layer 14 with radiation using a mask (not shown) produces exposed photoresist layer 22 (FIG. 2C, structure 28). Exposed photoresist layer 22 is composed of regions of exposed photoresist 24 and non-exposed photoresist 26. Exposed photoresist layer 22 is optionally given a post-exposure bake. Development using an aqueous alkaline developer removes exposed photoresist 24, producing initial layer 30 (i.e., initial patterned photoresist layer) composed of non-exposed photoresist, referred to as pre-treated photoresist 26 disposed on a first substrate surface 34 of substrate 10 (FIG. 2D, structure 36). Typically, pre-treated photoresist 26 has unacceptable solubility in the organic solvents for SA materials. A second substrate surface 32, uncovered by development, has substantially no photoresist thereon. Second substrate surface 32 can have the same or different surface properties compared to substrate surface 12. Second substrate surface 32 can have residual photoresist or no photoresist disposed thereon. Optionally, the initial layer 30 can be processed to change its dimensions or geometry. For example, a process can be used to trim the dimensions of the photoresist features (e.g., a photoresist trim process) or cut the photoresist features (e.g., a double patterning process).

Figure 2E:
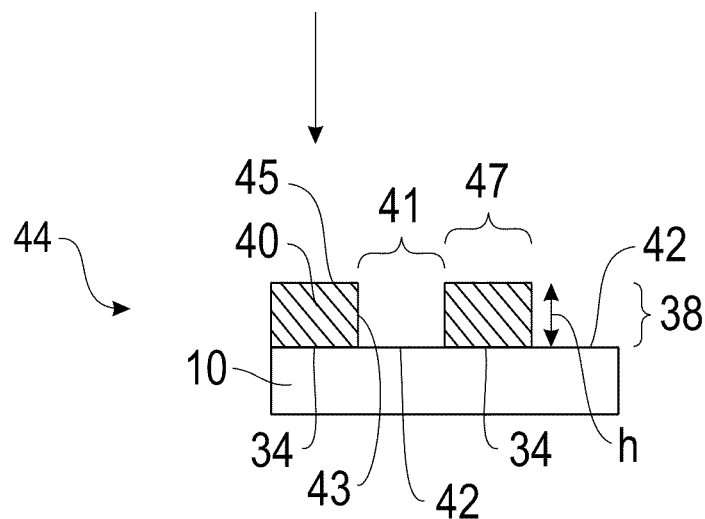

Once the desired initial layer 30 is obtained, the initial layer is given a treatment that induces a polarity increase in the pre-treated photoresist 26, forming treated layer 38 (i.e., treated patterned photoresist layer) comprising treated photoresist 40 (FIG. 2E, structure 44). Treated photoresist 40 is not soluble in a organic casting solvent for the SA material. Second substrate surface 42 of the treated layer 38 can have the same or different surface properties compared to second substrate surface 32 of structure 36. Covered first substrate surface 34 is also indicated in structure 44.

The surfaces of photoresist features 47 and second substrate surface 42 of structure 44 (FIG. 2E) provide a graphoepitaxial pre-pattern for self-assembly of the SA material. In one embodiment, at least one surface has a preferential affinity for one domain of the self-assembled material. The SA material can be located in the trench area 41 and/or on the mesa (the top surface 45 in FIG. 2E) of photoresist feature 47, depending on the preferential surface affinities of treated photoresist 40 and the second substrate surface 42. Usually, photoresist sidewall 43 of trench 41 and/or second substrate surface 42 have a preferential affinity for one domain of the self-assembled material. In some instances, second substrate surface 42 in combination with the topography and other surfaces can support, for example, a particular orientation of the domains in the domain pattern. In an embodiment of graphoepitaxy, the height h (FIG. 2E) of trench 41 is greater than or comparable to the thickness of the SA materials, and the SA material is substantially located in the trench 41 of the treated layer. Further, sidewall 43 and uncovered second substrate surface 42 have a preferential affinity for a first domain of the self-assembled material. In another embodiment, sidewall 43 has a preferential affinity for a first domain of the self-assembled material, and uncovered second substrate surface 42 has no preferential affinity for any domain of a self-assembled material. Trench 41 can have a height h (i.e., thickness) of from 50 to 10000 angstroms, more particularly 100 to 5000 angstroms, and even more particularly 300 to 3000 angstroms.

Figure 2H:
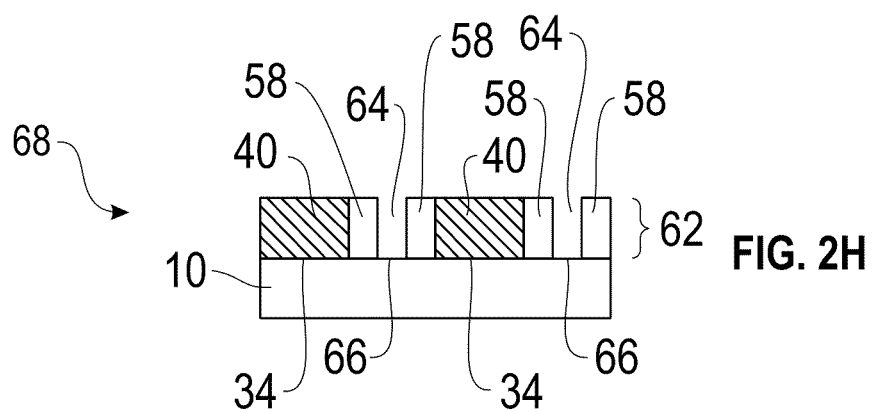
Figure 2I:
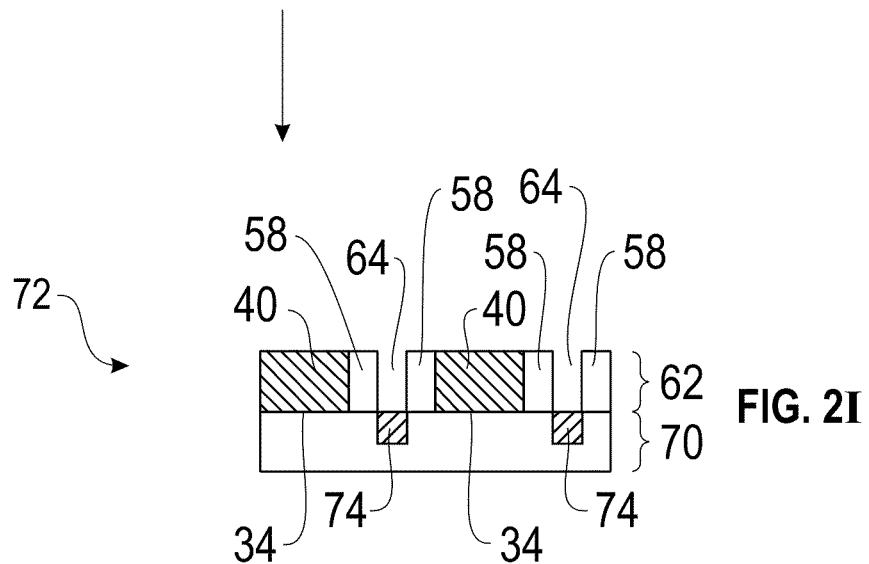

The SA material is dissolved in a preferably organic solvent and the resulting solution is cast on the treated layer 38. In an embodiment the organic solvent is a low polarity organic solvent such as anisole. In another embodiment, the organic solvent is a moderatly polar organic solvent such as a glycol or a glycol monoether. Treated photoresist 40 is not soluble in the organic solvent used to cast the SA material. Removing the organic solvent produces structure 52 (FIG. 2F) comprising layer 46 comprising regions of treated photoresist 40 and regions of SA material 48. In this example, SA material 48 is partially or substantially located in trench 41, disposed on second substrate surface 50 of substrate 10. SA material 48 is then allowed to self-assemble as directed by the topography and surface properties of treated photoresist 40 and substrate surface 50. SA material 48 can self-assemble spontaneously upon removal of the organic casting solvent, or with optional baking, and/or annealing, to form a domain pattern comprising, for example, perpendicularly oriented domains 56 and 58 of self-assembled material 48, as shown in layer 54 of structure 60 (FIG. 2G). Domains 56 and domains 58 comprise different components of SA material 48; that is, they are compositionally different. Domains 56 can, for example, comprise one block of a block copolymer, and domains 58 can comprise a different block of a block copolymer. Further, one of the domains, for example domains 56, can be selectively removed (e.g., by reactive ion etching), in the presence of the domains 58. As shown in FIG. 2H, selective removal of domains 56 results in a relief pattern 62 comprising the treated photoresist 40, domains 58 and, for example, openings 64 providing access to uncovered substrate surface 66 of substrate 10. Uncovered substrate surface 66 can have the same or different surface properties compared to substrate surfaces 12, 32, 42, and or 50. At this point, treated photoresist 40 can be removed by aqueous alkaline developer and/or a second organic solvent, if desired. Otherwise, relief pattern 62 can be transferred to substrate 10, indicated by altered regions 74 in modified substrate 70 (FIG. 2I, structure 72). Altered region 74 can be a line, hole, pit, or a chemically altered state of modified substrate 70. Alternatively, openings 64 can be filled with another material (e.g., a conductive metal) (not shown). The treated photoresist 40 can then be removed by development using an aqueous alkaline developer and/or a second organic solvent. The remaining self-assembled material can also be removed by the second organic solvent developer, by the same organic solvent used to cast the SA material, or a different organic solvent. The above described method advantageously forms an ordered pattern of domains of the self-assembled material without removing or crosslinking treated photoresist 40.

As indicated by this example, the surface properties of the treated photoresist and the substrate can be conducive to DSA after the polarity increasing treatment. This is not always the case. The effects of the treatment on the photoresist surface are generally independent of the effects of the treatment on the substrate surface, and should be determined empirically.

Advantageously, preferred methods utilize a standard positive-tone photoresist that operates by a non-crosslinking mechanism, and standard positive-tone development in an aqueous alkaline developer to form the initial layer 30. It is the non-exposed photoresist in initial layer 30 that is subsequently treated to produce non-crosslinked treated photoresist 40. The treated photoresist is rendered insoluble in the organic casting solvent for the SA material, yet retains solubility in aqueous alkaline developer. The treatment conditions can be adjusted for a range of organic solvents suitable for casting SA materials, from low polarity organic solvents to moderately polar organic solvents, without damaging the underlayer or substantially distorting the patterned photoresist features.

To further illustrate a multi-layered substrate, structure 60 of FIG. 2H is reproduced in structure 140 of FIG. 3, with the exception that substrate 142 of structure 140 has two layers, a bottom layer 144 and an intermediate layer 146. Bottom layer 144 of substrate 142 can be, for example, a silicon wafer. Intermediate layer 146 can be, for example, an ARC layer, where uncovered surface 148 is a surface of the ARC layer.

Also contemplated are negative-tone resists that operate by a polarity change mechanism rather than by a crosslinking mechanism. However, few, if any commercial high resolution photoresists operate by this mechanism. Therefore, the present method preferentially utilizes high resolution, positive-tone photoresists to make the initial patterned photoresist layer.

The increased polarity of the treated layer can vary depending on the photoresist material and the treatment conditions. As stated, the treatment of the initial layer can be photochemical, thermal, chemical, or a combination thereof. In an embodiment, the initial layer is given a photochemical treatment comprising exposing the initial layer to second radiation. The exposure can be performed with a single wavelength of radiation or a combination of suitable wavelengths (broad band) of radiation, so long as the exposure is effective in inducing the desired solubility change in the initial layer. For example, the second exposure can be performed with a broad band deep ultraviolet (DUV) source such as a Hg/Xe 500 W short-arc lamp (UXM-501MA) from Ushio America. In an embodiment, the second radiation is the same radiation used to form the initial layer. In another embodiment, the photochemical treatment is a flood exposure. The flood exposure can be a single conventional whole area exposure or a combination of conventional whole area exposures. The dose of the second radiation can be from 1 to 200 mJ/cm$^2$, 1 to 150 mJ/cm$^2$, 1 to 100 mJ/cm$^2$, and more particularly from 1 to 50 mJ/cm$^2$. The optimal dose of the second radiation will depend upon the intensity distribution of the irradiation wavelengths (e.g., broad distribution from an arc lamp or a narrow distribution from a line-narrowed excimer laser) and the sensitivity of the photoactive photoresist components to those respective wavelengths. The photochemical treatment can also be a scanning exposure delivered by digital writing device employing light emitting sources such as a laser, light-emitting diode (LED), or cathode ray tube (CRT). The photochemical treatment can be followed by a thermal treatment to chemically amplify the formation of polar groups in the treated photoresist layer. For example, the photochemical treatment of exposing the initial layer to second radiation can release an acid from a photoacid generator (PAG) in the exposed initial layer that upon subsequent baking catalyzes the deprotection of additional acid sensitive carboxylic acid esters, aromatic acetals/ketals, and/or carbonates, thereby increasing the concentration of carboxylic acid and phenol groups to form the treated layer. With sufficient polarity change, the treated layer can be rendered insoluble in a low polarity organic solvent (e.g., anisole) or more polar organic solvent (e.g., PGMEA) used to dissolve and cast the SA material. By way of example, the thermal treatment can comprise heating the initial layer or the exposed initial layer at a temperature of 60° C. to 300° C., 80° C. to 250° C., 80° C. to 200° C., 100° C. to 200° C., 150° C. to 200° C., 165° C. to 200° C., or 165° C. to 170° C. For example, heating can be performed at any of the foregoing temperatures for a period of at least 1 sec, 1 sec to 1 day, 1 sec to 12 hours, 1 sec to 1 hour, 10 sec to 30 minutes, 10 sec to 15 minutes, 1 minute to 15 minutes, 1 minute to 10 minutes, 2 minutes to 10 minutes, 3 minutes to 10 minutes, or 4 minutes to 6 minutes. More particularly, for example, the initial layer or the exposed initial layer can be heated at 60° C. to 300° C. for 1 sec to 1 hour, 80° C. to 250° C. for 10 sec to 10 minutes, 150° C. to 200° for 30 sec to 8 minutes, or 165° C. to 190° C. for 1 minute to 5 minutes. Even more particularly, the initial layer or the exposed initial layer can be heated at 175° C. to 185° C. for 1 minutes to 3 minutes. The thermal treatment can also sometimes be effective in inducing a desirable polarity change without an accompanying photochemical treatment. A chemical treatment can include, for example, contacting the initial patterned photoresist layer with the vapors of a volatile Lewis acid, such as hydrochloric acid, sulfuric acid, nitric acid, or a sulfonic acid. In each instance, the polarity change occurs substantially throughout the thickness of treated photoresist.

Advantageously, the treated photoresist layer can be easily removed using an aqueous alkaline developer and/or a second organic solvent after self-assembly of the SA material, such as a photoresist stripping solvent (e.g., propylene carbonate or gamma-butyrolactone) if the wafer needs to be reworked. Reworking a wafer can occur, for example, when inspection detects unacceptable defects (e.g., misalignment) in the treated photoresist pattern. The wafer is stripped to remove the photoresist before being etched or otherwise irreversibly altered. The wafer can then be resubmitted to the photoresist pattern generating process.

As stated above, the substrate surface can, under certain conditions, also guide self-assembly of the SA material. As one example, the substrate can comprise a top layer of surface affinity control material whose surface properties are particularly suited for self-assembly. In this instance, substrate surface 12 would comprise the surface affinity control material. A surface control affinity material refers to any material, including organic or inorganic, that exhibits controlled wetting for at least one component of the self-assembled material, and therefore can guide DSA. Typically, the process steps of disposing, exposing, developing, and treating the photoresist layer to form the treated layer, which can also optionally include a pre-bake or a post-bake, can sufficiently alter the surface affinity control material to render it unsuitable for DSA of certain morphologies. In these instances, proper materials and process conditions should be selected to minimize damage to surfaces 12, 32 and 42.

The substrate, and more particularly the surface of the substrate, can comprise inorganic or organic materials such as metals, carbon, or polymers. More particularly, the substrate can comprise any semiconducting material including, for example, Si, SiGe, SiGeC, SiC, Ge alloys, GaAs, InAs, InP, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, undoped or contain both doped and undoped regions therein. A substrate comprising a surface affinity material such as a silicon native oxide, silicon oxide, or silicon nitride can be preferentially wetted by, for example, PMMA block components, but not by PS block components of a PS-b-PMMA block copolymer. The substrate can have a top ARC layer or bottom ARC (BARC) layer to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

Other non-limiting examples of surface affinity control materials include materials used in ARC layers, which can include random copolymers selected from the group of homopolymers or copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (optical constants, surface energy). The polymer components also typically contain a plurality of reactive sites distributed along the polymer for reaction with a crosslinking component. More specific materials used in ARC layers include polymers disclosed in US Patent Application 20090186294, including poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly (bisphenol AF)), poly(4,4'-hexafluoroisopropylidenebisbenzoate-co-epichlorohydrin), poly(3,3',4,4'-benzophenonetetracarboxylate-co-epichlorohydrin), poly(4,4'- hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), and glycidyl end-capped poly(bisphenol A-co-epichlorohydrin). A more specific ARC layer comprises silicon, such as Shin Etsu A940. Another more specific surface affinity control material described in U.S. Pat. No. 7,521,090 comprises poly(styrene-co-epoxydicyclopentadiene methacrylate) (P(S-r-EDCPMA)):

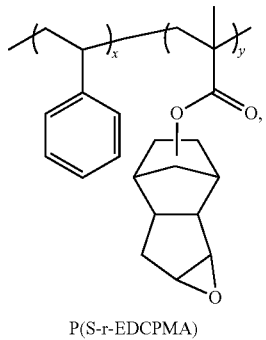

P(S-r-EDCPMA)

wherein x and y are each integers equal to or greater than 1. Other surface affinity control materials include poly(styrene-co-methyl methacrylate-co-expoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI). Other surface affinity control materials comprise polymer brush layers including those formed by hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing surface affinity control materials. Other surface affinity control materials include self-assembled monolayers.

The photoresist layer is prepared by disposing a photoresist composition on a substrate. The photoresist composition comprises a photoresist and optionally selected additives that do not adversely affect the desirable properties of the treated photoresist, such as its preferential wetting properties with the SA material, dimensional stability, and insolubility in the organic casting solvent for the SA material. Exemplary optional additives include photo-acid generator, thermal acid generator, acid amplifier, photobase generator, thermal base generator, photo-destructible base, surfactant, organic solvent for the photoresist composition, base quencher, sensitizer, and combinations of the foregoing additives.

The photoresist can comprise a polymer having repeating units derived from one or more monomer units, in particular a tertiary ester moiety. The polymer can be a copolymer, a terpolymer, or a tetrapolymer. Examples of tertiary ester moieties include those that can be deprotected by an acid generated from a photoacid generator (PAG) such as those disclosed in U.S. Pat. No. 4,491,628, "Positive- and Negative-working Resist Compositions with Acid Generating Photoinitiator and Polymer with Acid Labile Groups Pendant From Polymer Backbone" to H. Ito, et al. Non-limiting examples of tertiary ester moieties include ester derivatives of structural groups such as: methyladamantane, ethyladamantane, methylcyclopentane, ethylcyclopentane, methylcyohexane, ethylcycohexane, methylcycloheptane, ethylcyclohepatane, methylcyclooctane, and ethylcyclooctane. Other tertiary esters include trityl esters, isobornyl esters, dicyclopropylmethyl esters, dimethylcyclopropylmethyl esters and t-butyl esters. Repeating units can comprise a wide range of other acid labile groups, including for example, tertiary carbonates of phenols, benzyl esters, benzyhydryl esters, acetals, ketals, trialkylsilyl esters such as trimethylsilyl ester, tetrahydrofuranyl esters, tetrahydropyranoyl esters, 3-oxocyclohexanonyl, and mevalonic lactonyl esters, and the like. The polymer can also have repeating units containing a lactone moiety in combination with repeating units containing at least one acid labile moiety, where such a configuration can impart good lithographic performance to the photoresist. When desirable, lactone moieties can improve dissolution in aqueous developer. Examples of repeating units containing lactones moieties include 5-methacryloyloxy-2,6-norbornanecarbo-gamma-lactone, 3-methacryloyloxymethyl-2,6-norbornanecarbo lactone, 3-acryloyloxymethyl-2,6-norbornanecarbo lactone, alpha-acryloyloxy-gamma-butyrolactone, alpha-methacryloyloxy-gamma-butyrolactone, beta-acryloyloxy-gamma-butyrolactone and beta-methacryloyloxy-gamma-butyrolactone.

Other examples of suitable chemically-amplified resists for use at 248 nm, 193 nm, 157 nm, extreme ultraviolet (EUV), and e-beam lithography can be found in Ito in "Chemical Amplification Resists for Microlithography" Adv. Polym. Sci., vol. 172, pp. 37-245 (2005).

The photoresist can also comprise a blend of two or more polymers. In particular, the photoresist is a non-crosslinking, photoresist capable of chemical amplification.

More specific positive-tone resists include JSR AM2073J (a commercial non-crosslinking, positive-tone, 193 nm photoresist capable of chemical amplification), JSR AR2928JN (a commercial non-crosslinking, positive-tone, 193 nm photoresist capable of chemical amplification), and poly(t-butyloxycarbonyloxystyrene-co-methyl methacrylate) P(BOCST-r-MMA), a 248 nm/e-beam photoresist capable of chemical amplification.

A photosensitive acid generator (PAG) is capable of releasing or generating acid upon exposure to radiation. Exemplary PAGs include, for example, (trifluoro-methylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, sulfonic acid esters of N-hydroxyamides, imides, and combinations thereof.

A thermal acid generator (TAG) is capable of releasing or generating acid upon heating. Exemplary thermal acid generators include diaryl iodonium salts, sulfonate esters of oximes, sulfonate esters of benzyl alcohols, sulfonate esters of imides, N-allyl-N-dimethylanilinium hexafluoroantimonate salts, and N-crotyl-N-dimethylanilinium hexafluoroantimonate salts, and sulfonic ester compounds such as cyclohexyl p-toluenesulfonate, cyclohexyl propanesulfonate, cyclohexyl methanesulfonate, cyclohexyl octanesulfonate, cyclohexyl camphorsulfonate, and combinations thereof.

An acid amplifier is a compound that is decomposed with an acid to generate an acid. For these compounds, reference should be made to J. Photopolym. Sci. and Tech., 8, 43-44, 45-46 (1995), and J. Photopolym. Sci. and Tech., 9, 29-30 (1996). Non-limiting examples of acid amplifiers include tert-butyl-2-methyl-2-tosyloxymethyl acetoacetate and 2-phenyl-2-(2-tosyloxyethyl)-1,3-dioxolane. Of well-known photoacid generators, many of those compounds having poor stability, especially poor thermal stability, and exhibit an acid amplifier-like behavior.

A photobase generator (PBG) generates a base upon exposure to radiation. Photobase generators include quaternary ammonium dithiocarbamates, alpha aminoketones, oximeurethane containing molecules such as dibenzophenoneoxime hexamethylene diurethane, ammonium tetraorganylborate salts, N-(2-nitrobenzyloxycarbonyl) cyclic amines, and combinations thereof.

A photo-destructible base (PDB) is a base that by exposure to radiation is converted into a species that does not interfere with an acid. For example, triphenylsulfonium hydroxide (TPSH), upon exposure, is converted into water and neutral organic species.

A thermal base generator (TBG) forms a base upon heating above a first temperature, T. T can be a temperature of about 140° C. or greater, such as 140° C. to 260° C. The thermal base generator can comprise a functional group selected from the group consisting of amide, sulfonamide, imide, imine, O-acyl oxime, benzoyloxycarbonyl derivative, quarternary ammonium salt, nifedipine, carbamate, and combinations thereof. Exmplary thermal base generators include o-{(.beta.-(dimethylamino)ethyl)aminocarbonyl}benzoic acid, o-{(.gamma.-(dimethylamino)propyl) aminocarbonyl}benzoic acid, 2,5-bis{(.beta.-(dimethylamino)ethyl)aminocarbonyl}terephthalic acid, 2,5-bis{(.gamma.-(dimethylamino)propyl) aminocarbonyl}terephthalic acid, 2,4-bis{(.beta.-(dimethylamino)ethyl)aminocarbonyl}isophthalic acid, 2,4-bis{(.gamma.-(dimethylamino)propyl) aminocarbonyl}isophthalic acid, and combinations thereof.

The photoresist composition can further comprise a surfactant. Surfactants can be used to improve coating uniformity, and can include ionic, non-ionic, monomeric, oligomeric, and polymeric species, or combinations thereof. Examples of possible surfactants include fluorine-containing surfactants such as the FLUORAD series available from 3M Company in St. Paul, Minn., and siloxane-containing surfactants such as the SILWET series available from Dow Chemical.

The photoresist composition can include an organic solvent to dissolve the other components, so that the photoresist can be disposed evenly on the surface of the substrate to provide a defect-free coating. Non-limiting examples of organic solvents for the photoresist composition include ethers, glycol ethers, aromatic hydrocarbons, ketones, esters, ethyl lactate, gamma-butyrolactone, cyclohexanone, ethoxyethylpropionate (EEP), a combination of EEP and gamma-butyrolactone (GBL), propylene glycol methyl ether acetate, and mixtures thereof. The organic solvent for the photoresist composition can include the above-described organic casting solvent for the SA material or the second organic solvent used to remove the treated photoresist.

Exemplary base quenchers comprise aliphatic amines, aromatic amines, carboxylates, hydroxides, or combinations thereof. For example, base quenchers can include: dimethylamino pyridine, 7-diethylamino-4-methyl coumarin (Coumarin 1), tertiary amines, sterically hindered diamine and guanidine bases such as 1,8-bis(dimethylamino)naphthalene (PROTON SPONGE), berberine, or polymeric amines. Tetraalkyl ammonium hydroxides or cetyltrimethyl ammonium hydroxide can be used as a base quencher when the PAG is an onium salt.

Sensitizers include polycyclic aromatics such as pyrene, perylene, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane, and combinations thereof.

The photoresist composition can comprise about 1% by weight (wt. %) to about 30 wt. % of photoresist based on the total weight of the photoresist composition, more particularly about 2 wt. % to about 15 wt. %.

The photoresist composition can comprise from about 0.5 wt. % to about 20 wt. % of a photoacid generator based on the weight of the photoresist in the photoresist composition, more particularly from about 0.5 wt. % to about 10 wt. % based on the weight of the photoresist in the photoresist composition.

The photoresist composition can comprise from about 0.01 wt. % to about 20 wt. % thermal acid generator based on the weight of the photoresist in the photoresist composition, more particularly from about 0.1 wt. % to about 10 wt. %.

The photoresist composition can comprise from about 0.01 wt. % to about 20 wt. % acid amplifier based on the weight of the photoresist in the photoresist composition, more particularly from about 0.1 wt. % to about 10 wt. %.

The photoresist composition can comprise from about 0.01 wt. % to about 20 wt. % photobase generator based on the weight of the photoresist in the photoresist composition, more particularly from about 0.1 wt. % to about 10 wt. %.

The photoresist composition can comprise from about 0.01 wt. % to about 10 wt. % thermal base generator based on the weight of the photoresist in the photoresist composition, more particularly from about 0.1 wt. % to about 10 wt. %.

The photoresist composition can comprise from about 0.01 wt. % to about 20 wt. % photo-destructible base based on the weight of the photoresist in the photoresist composition, more particularly from about 0.1 wt. % to about 10 wt. %.

The photoresist composition can further include about 0.001 wt. % to about 0.1 wt. % of surfactant based on the total weight of photoresist in the photoresist composition.

The photoresist composition can comprise from about 70 wt. % to about 99 wt. % organic solvent based on the total weight of the photoresist composition, more particularly from about 85 wt. % to about 98 wt. %.

The photoresist composition can further include about 0.01 wt. % to about 1.0 wt. % of base quencher based on the total weight of the photoresist in the photoresist composition.

The photoresist composition can comprise from about 0.01 wt. % to about 30 wt. % sensitizer based on the weight of the photoresist in the photoresist composition, more particularly from about 0.1 wt. % to about 20 wt. %.

The photoresist layer can be formed by processes such as spin coating (also referred to as spin casting), spray coating, dip coating, doctor blading, roll coating, and the like, which can be used individually or in combinations thereof in accordance with the methods of the present invention. More particularly, a solution of the photoresist in a suitable organic solvent is spin coated onto the surface of the substrate, followed by removal of the organic solvent to produce the photoresist layer. In general, the photoresist layer can have a thickness of 100 to 10000 angstroms, more particularly 150 to 5000 angstroms, and even more particularly 200 to 3000 angstroms. The photoresist layer can be given a post-apply bake at a temperature of 50° C. to 300° C., more particularly 50° C. to 200° C., for a period of 1 sec to 1 hour, more particularly 1 sec to 5 minutes.

Pattern-wise exposure of the photoresist layer can be accomplished using radiation of various types, including ultraviolet (UV) radiation of wavelengths from 400 nm to 300 nm, deep ultraviolet (DUV) radiation of wavelengths from 300 nm to 200 nm, extreme ultraviolet (EUV) radiation of wavelengths from 120 nm to 4 nm, electron-beam (e-beam) radiation, x-ray radiation, and combinations of the foregoing. DUV and EUV exposures employ a specific mask to generate patterns in the positive tone photoresist layer. E-beam lithography writes patterns directly to the photoresist. Exemplary radiation sources include single wavelength and/or narrow band radiation sources, specific mercury emission lines, lasers, and particle beam emitters. For less stringent conditions, a broad band multiple wavelength source can be used. More particularly, the radiation wavelength is selected from the group consisting of 436 nm, 405 nm, 365 nm, 334 nm, 313 nm, 257 nm, 248 nm, 193 nm, 157 nm, 126 nm, and 13.5 nm. Even more particularly, the wavelength of the radiation is selected from the group consisting of 248 nm, 193 nm, 157 nm, and 13.5 nm. Still more specifically, the wavelength of the radiation for the pattern-wise exposure is 193 nm. The pattern-wise exposure at 193 nm can be performed either dry or under immersion conditions. In particular, the pattern-wise exposure may be accomplished by 193 nm water-immersion lithography. In order to accommodate patterning by 193 nm water-immersion lithography, a protective topcoat layer may be applied to the surface of the photoresist prior to exposure via immersion lithography. Preferably, the topcoat layer is base-soluble and is removed during the photoresist development step by the alkaline photoresist developer. Alternatively, the photoresist may comprise surface-active components which control the surface properties of the coated photoresist and limit the extraction of photoresist components into the immersion fluid.

SA materials are comprised of immiscible materials that can phase segregate into domains. Phase segregation can be found in different types of polymer blends (e.g., binary, ternary) as well as block copolymers comprising two or more different polymeric block components.

SA materials for directed self-assembly can comprise immiscible polymer blends. The term "immiscible" as used herein refers to two or more polymers in the polymer blend being incompatible enough to drive phase segregation under certain process conditions. The immiscibility of the polymers in the polymer blends can depend on the composition as well as the film forming process of the polymer blends. The ratio of the polymers, molecular weight of the individual polymers in the blend, and the presence of other additional components in the blend can be used to adjust the compatibility of the polymers in the polymer blend. Temperature, coating conditions, the treated photoresist topography, treated photoresist surface properties, and substrate surface properties can also affect the phase segregation of the polymers. As used herein, an "immiscible polymer" is a polymer that in a polymer blend composition phase segregates on a properly prepared substrate surface under appropriate process conditions.

Examples of suitable polymers for the two or more immiscible polymers include: cellulose, poly(acrylamide), polyethyleneimine, poly(acrylic acid), poly(2-ethyl-2-oxazoline), poly(ethyleneoxide), and poly(vinyl alcohol), novolac resins, cresol resins, poly(hydroxystyrene), poly(acrylic acid), poly(styrene sulfonic acid), poly(vinyl phosphoric acid), poly(vinyl sulfonic acid), poly(2-sulfoethyl methacrylate), poly(2-sulfopropyldimethyl-3-methacrylamide), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic sulfonamide polymers, poly(styrene), poly(hydroxyadamantyl methacrylate), poly(isobornyl methacrylate), poly(phenyl methacrylate), poly(vinyl naphthalene), polysiloxanes, polymethylsilsesquioxanes, polycarbosilanes, poly(vinyl ferrocene), poly(acylonitrile), poly(caprolactone), poly(lactide), poly(methyl methacrylate), poly(2-hydroxyethyl methacrylate), poly(gamma-butyrolactone methacrylate), poly(tetrahydrofuranyl methacrylate), poly(tetrahydropyranyl methacrylate), poly(allyl amine), poly(4-aminostyrene), poly(2-dimethylaminoethyl methacrylate), polyethyleneneimine, poly(N-methylvinylamine), poly(vinyl pyridine), poly(isoprene), poly(butadiene), poly(nobornene), poly(ethylene), poly(propylene), poly(1,1,1-trifluoro-2-(trifluoromethyl)-2-hydroxy-pentan-4-yl methacrylate), fluoroalcohol-based polymers, poly(2-ethyl-trifluoromethanesulfonamide methacrylate), acidic fluoro sulfonamide polymers, poly(2,2,2-trifluoroethyl methacrylate), poly(hexafluoroisopropyl methacrylate), poly(2,3,4,5,6-pentafluorostyrene), and substituted derivatives thereof. The two or more immiscible polymers can be selected such that each polymer is immiscible with each other polymer in the blend.

The SA material can comprise a block copolymer, or blends of block copolymers and other polymers. In an embodiment, the block copolymer consists essentially of a first polymeric block component A and a second polymeric block component B that are immiscible with each other. Typically, homopolymers of suitable immiscible block components form a blend that exhibits multiple glass transition temperatures representing each homopolymer phase. Preferably, one of the components A and B is selectively removable without having to remove the other, so as to form either isolated and orderly arranged structural units composed of the un-removed component, or a continuous structural layer containing isolated and orderly arranged cavities formed after the removable component has been removed. Alternatively, the components A and B can simply have different electrical, optical, and/or magnetic properties, so that the ordered patterns composed of such components A and B can be used for fabricating different device structures.

The block copolymer can comprise blocks comprising one or more monomers, in which at least two blocks in the block copolymer are compositionally, structurally, or both compositionally and structurally, non-identical. Suitable block copolymers include di-block copolymers, tri-block copolymers, or multi-block copolymers, any of which can be used in conjunction with DSA to further enhance the resolution. The blocks themselves can be homopolymers, or copolymers, including terpolymers. The SA material can comprise an amphiphilic organic block copolymer, amphiphilic inorganic block copolymer, organic di-block copolymer, organic multi-block copolymer, inorganic-containing di-block copolymer, inorganic-containing multi-block copolymer, linear block copolymer, star block copolymer, dendritic block copolymer, hyperbranched block copolymer, graft block copolymer, or a combination comprising at least one of the foregoing block copolymers. In an embodiment, the block copolymer is a di-block copolymer. Combining a suitable tri-block copolymer and a chemical pre-pattern can, for example, be used to quadruple the spatial frequency of the chemical pre-pattern.

The block components can in general be any appropriate microdomain-forming block that can be copolymerized with, attached to, or self-organize with another dissimilar block. Blocks can be derived from different polymerizable monomers, where the blocks can include but are not limited to: polyolefins including polydienes, polyethers including poly(alkylene oxides) such as poly(ethylene oxide), poly(propylene oxide), poly(butylene oxide), or random or block copolymers of these; poly((meth)acrylates), polystyrenes, polyesters, polyorganosiloxanes, polyorganogermanes, and the like.

In an embodiment, the blocks of the block copolymer comprise repeating units derived from $C_{2-30}$ olefinic monomers, (meth)acrylate monomers derived from $C_{1-30}$ alcohols, inorganic-containing monomers including those based on Fe, Si, Ge, Sn, Al, Ti, or a combination comprising at least one of the foregoing monomers. In a specific embodiment, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or alpha-methylstyrene; and can include as (meth)acrylate monomers, methyl (meth)acrylate, ethyl (meth)acrylate, n-propyl (meth)acrylate, isopropyl (meth)acrylate, n-butyl (meth)acrylate, isobutyl (meth) acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, or hydroxyethyl (meth)acrylate. Combinations of two or more of these monomers can be used. Exemplary blocks that are homopolymers include blocks prepared using styrene (i.e., polystyrene blocks), or (meth)acrylate homopolymeric blocks such as poly(methyl methacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride dyad repeating structure due to the inability of maleic anhydride to homopolymerize under most conditions (e.g., poly(styrene-alt-maleic anhydride)) where "-alt-" indicates alternating polymeric blocks. It is understood that such blocks are exemplary and should not be considered to be limiting.

More specific di-block or tri-block copolymers include poly(styrene-b-vinyl pyridine) (PS-b-PVP), poly(styrene-b-butadiene) (PS-b-PBD), poly(styrene-b-isoprene) (PS-b-PI), poly(styrene-b-methyl methacrylate) (PS-b-PMMA), poly(styrene-b-alkenyl aromatics), poly(isoprene-b-ethylene oxide) (PI-b-PEO), poly(styrene-b-(ethylene-propylene)), poly(ethylene oxide-b-caprolactone), poly(butadiene-b-ethylene oxide) (PBD-b-PEO), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-dimethylsiloxane) (PS-b-PDMS), poly(styrene-b-ferrocenyldimethylsilane) (PS-b-PFS), poly(styrene-b-isoprene-b-ethylene oxide) (PS-b-PI-b-PEO), poly(styrene-b-isoprene-b-methyl methacrylate) (PS-b-PI-b-PMMA), poly(styrene-b-ferrocendimethylsilane-b-isoprene) (PS-b-PFS-PI), or a combination comprising at least one of the foregoing block copolymers.

The polymer blend or block copolymers can also comprise inorganic constituents, including inorganic-containing homopolymers, copolymers, and block copolymers, and inorganic-containing monomers, molecules, and additives. These include, for example, those based on silicon, germanium, iron, titanium, aluminum, or the like. Exemplary silicon- and germanium-containing monomers and polymers can include those disclosed by H. Ito in "Chemical Amplification Resists for Microlithography" *Adv. Polym. Sci.*, vol. 172, pp. 37-245 (2005); exemplary metal containing monomers and polymers include those disclosed by Ian Manners in "Synthetic Metal-containing Polymers", Wiley-VCH, 2004; exemplary silicon-containing molecules and additives such as organosilicates include those disclosed by E. M. Freer, L. E. Krupp, W. D. Hinsberg, P. M. Rice, J. L. Hedrick, J. N. Cha, R. D. Miller, and H. C. Kim in "Oriented mesoporous organosilicate thin films", *Nano Letters*, vol. 5, 2014 (2005); and exemplary metal-containing molecules and additives include those disclosed by Jinan Chai, Dong Wang, Xiangning Fan and Jillian M. Buriak, "Assembly of aligned linear metallic patterns on silicon", *Nature Nanotechnology*, vol. 2, p. 500, (2007).

The block copolymer desirably has an overall molecular weight and polydispersity amenable to further processing. In an embodiment, the block copolymer has a weight-averaged molecular weight ($M_w$) of 3,000 to 200,000 g/mol. Similarly, the block copolymer has a number averaged molecular weight ($M_n$) of 1,000 to 80,000. The block copolymer can also have a polydispersity ($M_w/M_n$) of 1.01 to 6, and is not particularly limited thereto. Molecular weight, both $M_w$ and $M_n$, can be determined by, for example, gel permeation chromatography using a universal calibration method, calibrated to polystyrene standards.

The block copolymers can be prepared by methods previously described in the art, including living polymerization techniques such as atom transfer free radical polymerization (ATRP), ring-opening metathesis polymerization (ROMP), and living cationic or living anionic polymerizations, for example.

In a particular embodiment, the block copolymer used for forming the self-assembled periodic patterns is PS-b-PMMA. The PS and the PMMA blocks in such a PS-b-PMMA block copolymer can have a total (summed over all blocks) number average molecular weight ($M_n$) ranging from about 5 kg/mol to about 300 kg/mol, with a total number average molecular weight from about 10 kg/mol to about 100 kg/mole being more typical. Each block can have a $M_n$ of 1 to 299 kg/mol, more particularly 1 to 99 kg/mol.

The morphology (shape, dimension, orientation) of the self-assembled domains from block copolymer thin films is a function of composition (material, molecular weight, volume ratio of different blocks), annealing condition (temperature, environment, annealing time), the interface properties (polymer-air interface, polymer substrate interface) as well as the defined geometry (film thickness, topography of the confinement). Therefore, by adjusting one or more parameters, the morphology can be adjusted to the need of specific applications.

In order to form the self-assembled periodic patterns, the block copolymer can be first dissolved in a suitable organic solvent system to form a block copolymer solution, which can then be applied onto the treated layer to form a thin block-copolymer layer disposed thereon. Optionally annealing the thin block-copolymer layer can aid in the self-assembly process of the polymeric block components.

In a preferred implementation, directed self-assembly using the treated layer is accomplished by first preparing a solution of the SA material in an organic solvent. In an embodiment, the SA material comprises at least one block copolymer. The organic solvent should fully dissolve all SA materials, but should not dissolve the treated photoresist. In an embodiment, the organic solvent used to develop the exposed photoresist layer is the organic solvent used to form the solution of the SA material. Non-limiting exemplary organic solvents for the SA material include substituted or unsubstituted aromatic hydrocarbons, substituted or unsubstituted aromatic ethers, substituted or unsubstituted aromatic alcohols, saturated monoalcohols comprising 5 to 20 carbons, glycols, ketones, glycol mono ethers, and glycol mono ether esters. In an embodiment, the organic solvent used to cast the SA material is a glycol, glycol mono ether, or glycol mono ether ester, or combinations thereof. More specific organic solvents for the SA material include but are not limited to toluene, xylene, mesitylene, diphenyl ether, diisopropyl ether, di(ethylhexyl)ether, ethyl lactate, ethylene glycol, propylene glycol, propylene glycol monomethyl ether acetate (PGMEA), propylene glycol monomethyl ether (PGME), 4-methyl-2-pentanol, n-butyl acetate, anisole, cyclohexanone, acetone, and combinations thereof. In an embodiment, the organic solvent for the SA material is ethylene glycol, propylene glycol, propylene glycol monomethyl ether acetate, propylene glycol monomethyl ether, 4-methyl-2-pentanol, or combinations thereof. The solution of SA material can have a concentration ranging from about 0.1 weight percent (wt. %) to about 5 wt. % SA material based on total weight of the solution. More particularly, the SA material is dissolved at a concentration ranging from about 0.5 wt. % to about 1.5 wt. %. In an embodiment, the solution of SA material comprises about 0.5 wt. % to about 1.5 wt. % PS-b-PMMA block copolymer dissolved in anisole. The solution of SA material can optionally further comprise additional block copolymers, homopolymers, random copolymers, surfactants and photoacid generators, photobase generators, thermal acid generators, thermal base generators, acid amplifiers, and photodestrucible bases.

The solution of SA material is cast onto the treated layer followed by removal of the organic solvent to form a thin film of the SA material (i.e., SA layer) disposed on the uncovered substrate surface, the treated photoresist surface(s), or both. In an embodiment, the SA material is substantially disposed in the trench of the treated layer. The solution of SA material can be cast onto the treated layer by any suitable technique, including, but not limited to: spin coating, roll coating, spraying, ink coating, dip coating, and the like. Additional annealing (including thermal annealing, thermal gradient annealing, solvent vapor annealing or other gradient field) can be optionally employed to remove defects in the SA layer and/or promote self-assembly of the SA material. More particularly, the SA layer comprising a block copolymer is thermally annealed at a temperature that is above the glass transition temperature ($T_g$) of the block copolymer but below the decomposition or degradation temperature ($T_d$) of the block copolymer. For example, the thermal annealing step can be carried out at an annealing temperature of about 100° C. to about 300° C. By way of example, the thermal annealing can be performed for a period of more than 0 hours to about 100 hours, and more particularly for about 1 hour to about 15 hours. The thermally annealed block copolymer self-assembles to form ordered domains whose orientation can be perpendicular to the underlying surface plane. In general, the SA material can have a thickness of 100 to 10000 angstroms, more particularly 500 to 5000 angstroms, and even more particularly 300 to 3000 angstroms.

The difference in the etch rates between two ordered domain regions of the block copolymer allows the generation of additional patterns. Selectively removing by etching, solvent or other means, at least one self-assembled domain, creates a nano-scale relief pattern comprising, for example, a pattern of openings that can be transferred into the underlying substrate. Types of etching include any common etching applied in the manufacture of semiconductor devices, for example, dry-etching such as plasma etching, or wet-etching using selective solvents. Typically, dry etching processes are employed for etching at sub-50 nm dimensions. Prior to this pattern development/pattern transfer, the self-assembled layer of SA material can be optionally chemically modified to improve properties necessary for pattern transfer, such as etch resistance or mechanical properties.

Also disclosed is the layered structure formed by the above-described method. In an embodiment, the layered structure is a semiconductor device. The method can be used to form layered structures comprising metal wiring lines, holes for contacts or vias, insulation sections (e.g., damascene trenches or shallow trench isolation), and trenches for capacitor structures suitable for the design of integrated circuit devices. The semiconductor device can comprise a substrate comprising an anti-reflection surface suitable for self-assembly of a block polymer; a treated photoresist layer comprising radiation exposed, non-crosslinking, chemically amplified photoresist disposed on a first area of the anti-reflection surface; and a self-assembled domain pattern comprising the block polymer disposed on a second area of the anti-reflection surface having no photoresist thereon. The self-assembled domain pattern of the polymer can be in the form of a relief pattern comprising, for example, a pattern of openings derived by selective etching of a first domain of the domain pattern in the presence of a second domain of the domain pattern. In an embodiment, the block copolymer comprises a polystyrene block and a poly(methyl methacrylate) block.

The above-described methods permit a photoresist feature width of, for example, from 1 to 1000 nm, from 1 to 500 nm, from 1 to 300 nm, from 1 to 200 nm, from 1 to 150 nm, or more particularly from 1 to 100 nm. When the SA material is a block copolymer or blend containing a block copolymer, the method advantageously allows domain patterns having reduced feature width and increased periodicity relative to the photoresist feature. In this case, the domain feature width can be, for example, from 1 to 50 nm, from 1 to 30 nm, or more particularly from 1 to 20 nm. When the SA material is an immiscible polymer blend, the method permits a photoresist feature size less than 200 nm, more particularly less than 150 nm, and even more particularly less than 100 nm. The domain feature sizes tend to be larger, ranging from 1 to 500 nm, from 1 to 250 nm, or more particularly from 1 to 150 nm. Secondly, the method advantageously utilizes a self-assembled material with reduced feature size and an increased periodicity relative to the pre-pattern.

The following non-limiting examples are provided to further illustrate the disclosed method.

EXAMPLES

Materials used in the following examples are listed in Table 1.

TABLE 1

| Material | Description | Company |
|---|---|---|
| AM2073J | 193 nm non-crosslinking, positive-tone photoresist capable of chemical amplification | JSR |
| AR2928JN | 193 nm non-crosslinking, positive-tone photoresist capable of chemical amplification | JSR |
| TCX014 | Topcoat | JSR |
| A940 | Antireflection material | Shin Etsu |
| ARC-29A | Antireflection material | Brewer Science |
| PS-b-PMMA | Poly(styrene-b-methyl methacrylate) block copolymer; | Polymer Source |
| PS-b-PMMA (46 k-21 k) | Poly(styrene-b-methyl methacrylate) block copolymer, $M_n$ = 46 k of the PS block, $M_n$ = 21 k of the PMMA block | Polymer Source |
| PS-b-PMMA (96 k-35 k) | Poly(styrene-b-methyl methacrylate) block copolymer, $M_n$ = 96 k of the PS block, $M_n$ = 35 k of the PMMA block | Polymer Source |
| PS-b-PMMA (22 k-22 k) | Poly(styrene-b-methyl methacrylate) block copolymer, $M_n$ = 22 k of the PS block, $M_n$ = 22 k of the PMMA block | Polymer Source |
| PS | Poly(styrene); $M_n$ = 22 k | Polymer Source |
| PMMA | Poly(methyl methacrylate) $M_n$ = 21 k | Polymer Source |
| P(S-r-EDCPMA) | poly(styrene-co-epoxydicyclopentadiene methacrylate-) random copolymer (S:EDCPMA = 70:30 mole/mole, $M_n$ = 7 k | IBM (non-commercial) |

Preparation of P(S-r-EDCPMA).

Poly(styrene-co-epoxydicyclopentadiene methacrylate) random copolymer was prepared by free-radical polymerization of styrene and epoxydicyclopentadiene methacrylate according to the method described in U.S. Pat. No. 7,521,090. $M_n$=7400 g/mol. PDI: 1.40

Example 1

Figures 4A, 4B:
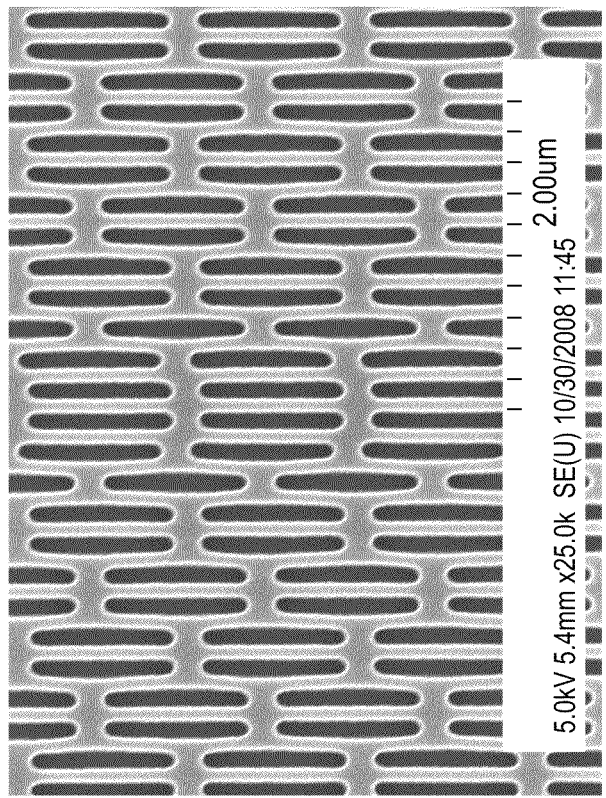
FIGS. 4A and 4B are scanning electron microscopy (SEM) images of different topographical features of the treated patterned photoresist layer of Example 1.
Figure 4D:
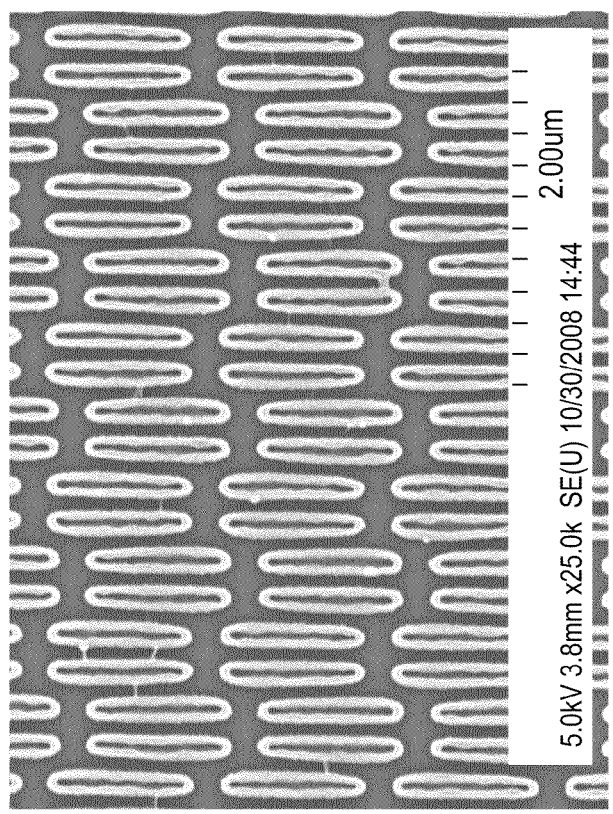
FIGS. 4C and 4D are scanning electron microscopy (SEM) images of the layered structure of Example 1 showing the self-assembled PMMA domains (bright parallel lines or donuts remaining after removal of the PS domains and the treated patterned photoresist layer using a rinse of cyclohexane followed by TMAH developer.
Figure 4C:
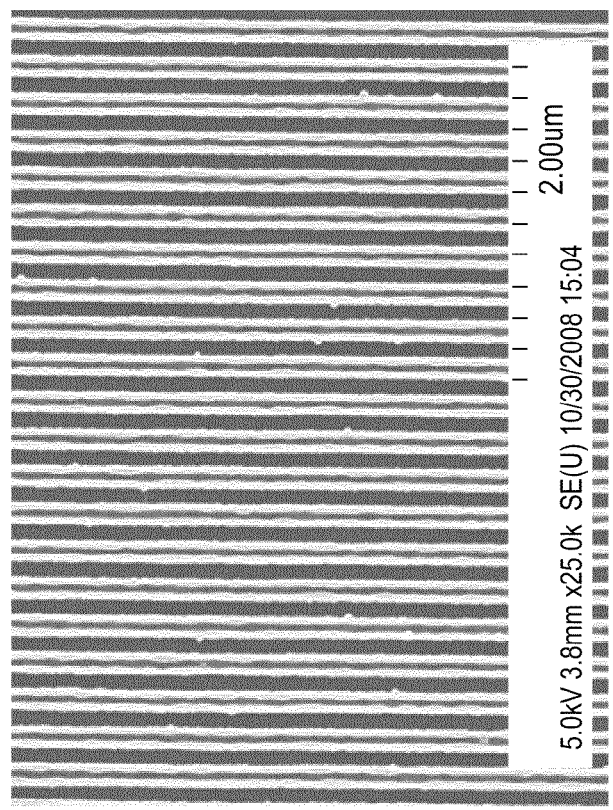

A topographical pre-pattern useful for DSA was made by pattern-wise exposing a layer of 193 nm photoresist (JSR AM2073J) on an anti-reflection coating (780 angstroms of ARC-29A, Brewer Science), carrying out a post-expose bake for 90 sec at 120° C., and developing using a standard aqueous alkaline developer (0.26N TMAH) to remove exposed photoresist, to form an initial patterned photoresist layer. The initial layer was flood-exposed (100 mJ/cm$^2$) using a broad band DUV source (a Hg/Xe 500 W short-arc lamp (UXM-501MA) from Ushio America) and baked at 110° C. for 1 minute to produce a treated patterned photoresist layer. FIGS. 4A and 4B show scanning electronic microscopy (SEM) images of different features of the topography of the treated layer. A 2% anisole solution of SA material was prepared comprising a blend of the polymers polystyrene (PS) ($M_n$=22 k), poly(methyl methacrylate) (PMMA) ($M_n$=21 k) and poly(styrene)-b-poly(methyl methacrylate) block copolymer, PS-b-PMMA (46 k-21 k) where $M_n$=46 k of the PS block, and $M_n$=21 k of the PMMA block. The dry blend ratio of PS:PMMA:PS-b-PMMA was 25:50:25 by weight. The solution of SA material was spin coated onto the treated layer, and the resulting SA layer was baked at 200° C. for 1 minute. The polymer blend was located primarily in the trench areas of the treated layer. Self-assembly of the polymer blend was directed by the topography and surface properties of treated photoresist to form PMMA domains adjacent to the trench sidewalls. The PS domains resided at the center areas of the trenches. The PS and the treated photoresist were then removed by a rinse of cyclohexane (60 sec) and a rinse of standard 0.26N TMAH developer (60 sec), respectively, to generate a sidewall image formed by the PMMA domains (FIGS. 4C and 4D).

Example 2

Figures 5A, 5B:
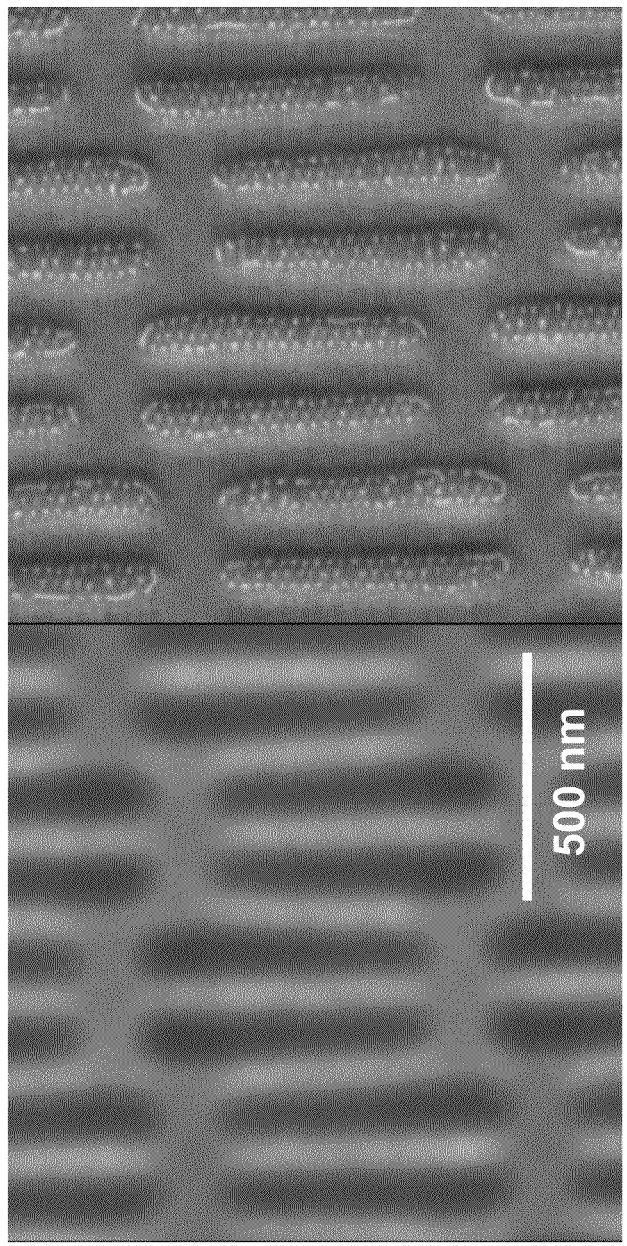
FIG. 5A is an AFM height image of the layered structure of Example 2 showing the self-assembled polymer blend (dark areas) disposed in the trench areas of the treated patterned photoresist layer.
FIG. 5B is an AFM phase image of the layered structure of Example 2 showing PMMA minority domains (cylindrical bright spots) disposed in the trench areas of the treated patterned photoresist layer.

A topographical pre-pattern for DSA was made by pattern-wise exposing a layer of 193 nm photoresist (AM2073J) on an anti-reflection coating (780 angstroms of ARC-29A, Brewer Science), carrying out a post-exposure bake for 90 seconds at 120° C., and developing with a standard aqueous alkaline developer (0.26N TMAH) to remove exposed photoresist. This was followed by a flood exposure of 100 mJ/cm$^2$ using a broad band DUV source (a Hg/Xe 500 W short-arc lamp (UXM-501MA) from Ushio America) and a post-exposure bake at 110° C. for 1 minute to form a treated patterned photoresist layer. A solution of SA material was prepared by dissolving a blend of the polymers PS-b-PMMA (46 k-21 k) and PS ($M_n$ 22 k) in anisole, in a dry blend ratio PS-b-PMMA: PS=8:2 by weight. The solution was then spin coated onto the treated layer, and the resulting structure was baked at 200° C. for 10 minutes. FIGS. 5A and 5B show atomic force microscopy (AFM) images of PMMA minority domains formed in trench areas of the treated layer. The term "minority" refers to the component having the lower volume fraction in the blend. The AFM height image (FIG. 5A) shows the self-assembled polymer in the trench areas (darker areas). The AFM phase image (FIG. 5B) shows PMMA minority domains (bright spots) at the corresponding positions.

Example 3

A topographical pre-pattern useful for DSA was made by exposing a layer of 193 nm photoresist (AM2073J) on an anti-reflection coating (ARC-29A, Brewer Science) using electron-beam lithography, carrying out a post-exposure bake for 90 seconds at 120° C., and developing with a standard aqueous alkaline developer (0.26N TMAH). This was followed by a flood exposure of 100 mJ/cm² using a broad band DUV source (a Hg/Xe 500 W short-arc lamp (UXM-501MA) from Ushio America) and another post-exposure bake at 110° C. for 1 minute to produce a treated patterned photoresist layer. The treated layer has an array of vias with an average diameter of 115 nm (FIG. 6A, SEM image). A 1 wt. % (weight %) solution of SA material was prepared by dissolving a blend of PS-b-PMMA (96 k-35 k) and PS ($M_n$=21 k) in anisole. The dry blend ratio of PS-b-PMMA:PS was 8:2 by weight. The solution was then spin coated onto the treated layer, the anisole was removed, and the resulting SA layer was baked at 200° C. for 5 minutes to form self-assembled domains comprising PMMA and PS in the openings of vias. The non-covered PMMA domains were selectively removed by oxygen plasma to form smaller vias at the center of the treated layer vias (FIG. 6B, SEM image).

Example 4

A treated patterned photoresist layer having a grating pattern with a pitch of 100 nm was made by pattern-wise exposing a layer of 193 nm photoresist layer (AR2928JN from JSR) disposed on an anti-reflection coating (A940 from Shin Etsu), carrying out a post-exposure bake for 60 seconds at 120° C. and developing the exposed photoresist layer using a standard aqueous alkaline developer (0.26N TMAH) to form an initial patterned photoresist layer. The initial layer was then trimmed using TCX014 to reduce the line width. Then the initial layer was given a flood exposure of 130 mJ/cm² using a broad band DUV source (a Hg/Xe 500 W short-arc lamp (UXM-501MA) from Ushio America) followed by a post-exposure bake at 115° C. for 1 minute to produce a treated patterned photoresist layer. An SEM image of the resulting treated patterned photoresist layer is shown in FIG. 7A (brighter lines). The treated layer was then baked at 170° C. (one sample for 1 minute, another sample for 5 minutes), followed by a rinse with PGMEA. For the sample baked at 170° C. for 1 minute, almost no treated patterned photoresist layer was observed after the PGMEA rinse (FIG. 7B, SEM image). For the second sample baked for 5 minutes at 170° C., the treated patterned photoresist layer remained after the PGMEA rinse (FIG. 7C, SEM image), allowing for a subsequent layer of materials to be cast on the treated patterned photoresist layer. Further, very little photoresist reflow was observed with the second sample heated for 5 minutes at 170° C.

Example 5

Figure 8A:
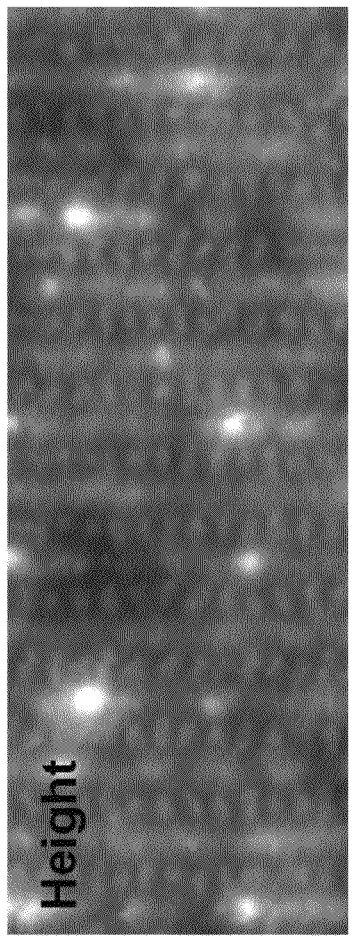
FIGS. 8A and 8B are AFM height and phase images, respectively, of the self-assembled domains of Example 5, which are directed by a treated patterned photoresist that is compatible with PGMEA.
Figure 8B:
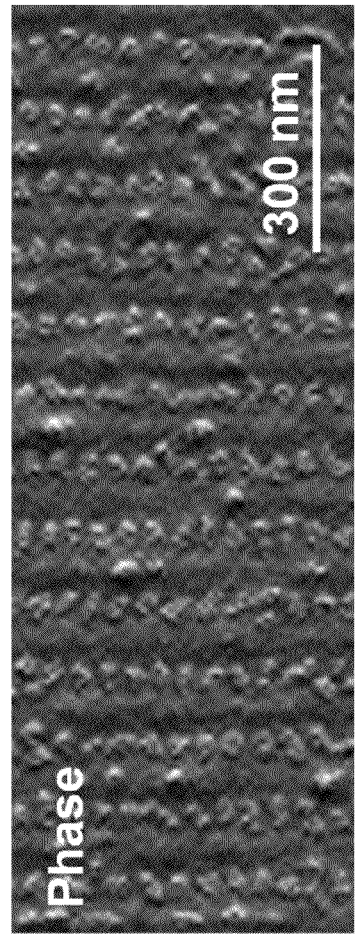

A treated patterned photoresist layer having a grating pattern with a pitch of 100 nm was made by pattern-wise exposing a layer of 193 nm positive-tone photoresist (AR2928JN from JSR) disposed on an anti-reflection coating (A940 from Shin Etsu), carrying out a post-exposure bake for 60 seconds at 120° C. and developing the exposed photoresist layer using a standard aqueous alkaline developer (0.26N TMAH) to form an initial patterned photoresist layer comprising non-exposed photoresist. The initial layer was then trimmed using TCX014 to reduce the line width. The trimmed initial patterned photoresist layer was given a flood exposure of 130 mJ/cm² using a broad band DUV source (a Hg/Xe 500 W short-arc lamp (UXM-501MA) from Ushio America) followed by a post-exposure bake at 115° C. for 1 minute and 185° C. for 2 minutes to produce a treated patterned photoresist layer. A 1 wt. % PGMEA solution, based on total weight of the solution, of a polymer blend of PS-b-PMMA (46 k-21 k) block copolymer and PS (22 k) homopolymer (weight ratio=8:2) was then spin coated on the treated patterned photoresist layer to form a SA layer of the block copolymer blend. The SA layer was baked at 200° C. for 2 minutes to form a pattern of self-assembled PMMA domains (brighter oval dots in the AFM height image of FIG. 8A) in the trenches of the photoresist line pattern (bright lines in the AFM height image of FIG. 8A). The PMMA domain pattern is also shown as brighter dots in the AFM phase image (FIG. 8B).

Example 6

Figure 9A:
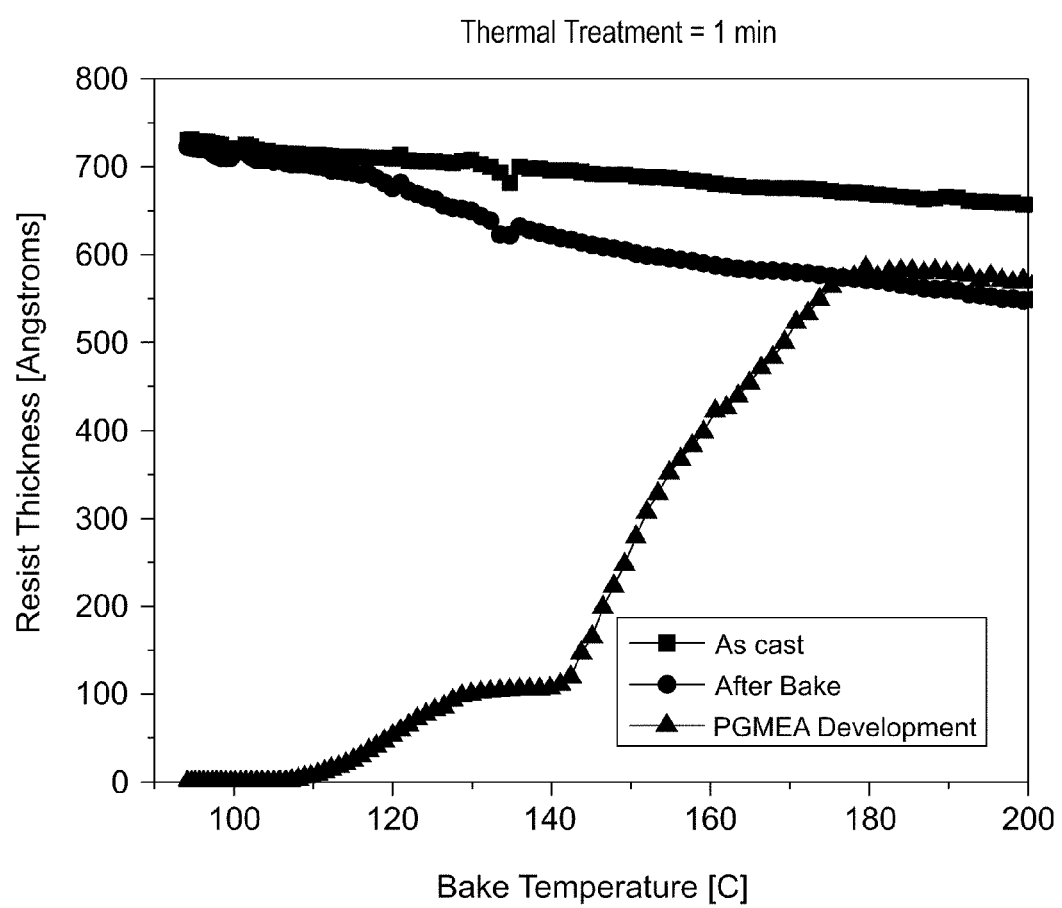
FIGS. 9A and 9B show the impact of a 1 minute and 5 minute thermal treatment on the thickness of exposed photoresist prior to and after a development process using PGMEA (Example 6). Treating the photoresist at higher bake temperatures is sufficient to render it insoluble in PGMEA.
Figure 9B:
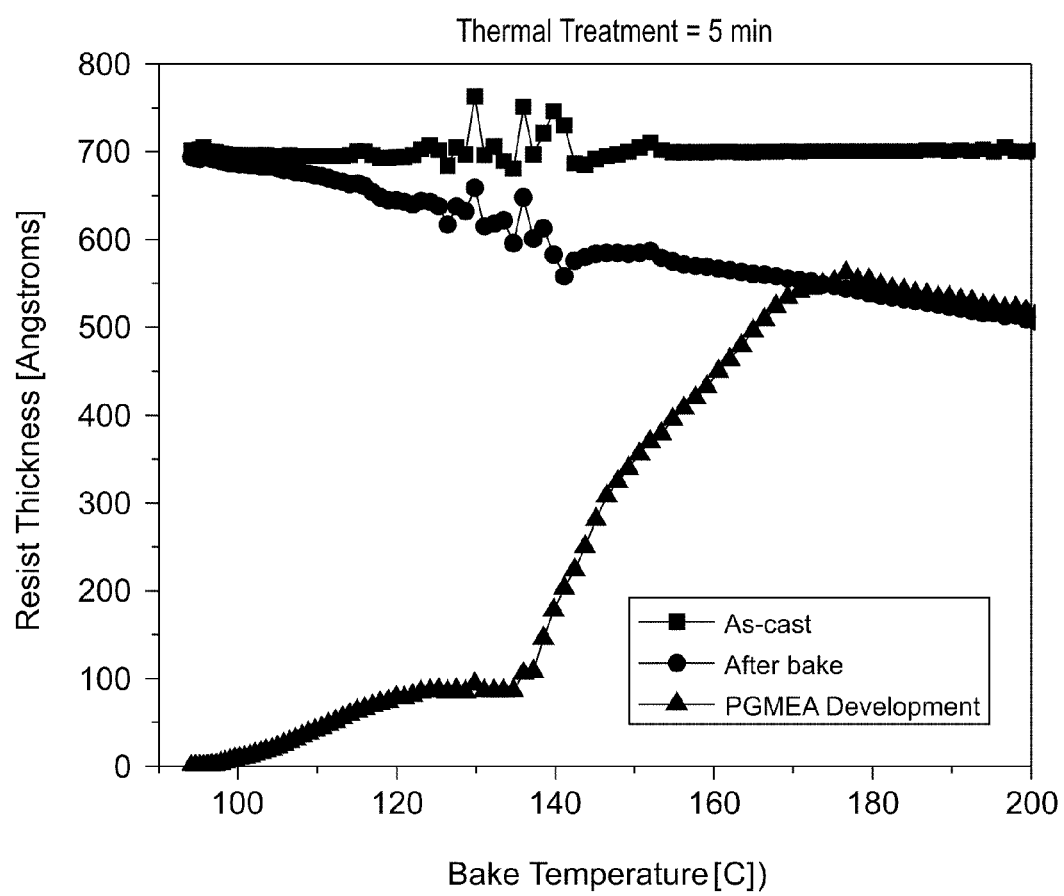

This experimental series demonstrates the effect of bake temperature for two different bake times (1 min and 5 min) on the solubility in PGMEA of a flood exposed photoresist layer. A solution comprising a 193 nm photoresist (JSR AR2928JN) was spin coated (3000 rpm for 30 s) onto a substrate having an anti-reflection top layer coating (780 angstroms of ARC-29A, Brewer Science) on silicon. This is designated the "As-cast" layer. The thickness of the photoresist layer was measured at 125 points across the "As-cast" wafer. The photoresist layer was given a post-application bake (PAB) for 60 sec at 120° C. The photoresist layer was then flood exposed with a broad band DUV source (a Hg/Xe 500 W short-arc lamp (UXM-501MA) from Ushio America) at a dose of 150 mJ/cm². The exposed wafer was then given a post-exposure bake (PEB) for 60 sec at 115° C. The wafer was then subjected to a thermal gradient heat treatment at temperatures ranging from 50° C. to 200° C. for 1 minute or 5 minutes using a thermal gradient hotplate. The thickness of the photoresist layer was measured at 125 points across the "After Bake" wafer and each thickness measurement was correlated with the corresponding temperature of the thermal gradient. The photoresist thickness decreases in roughly a linear relationship to the bake temperature likely due to evaporation (i.e., outgassing) of deprotection fragments and densification of the photoresist film. The results are shown as curves labeled "As-cast" and "After Bake" in FIGS. 9A and 9B. An "After Bake" wafer was developed in PGMEA for 60 sec and the remaining photoresist thickness was re-measured in the same manner. The results are shown as "PGMEA development" in FIGS. 9A and 9B. The results show that at a gradient temperature of about 180° C. and a heating time of 1 minute, no additional thickness loss in the photoresist layer is observed as a result of the PGMEA development process, which indicates that the film has become fully insoluble in PGMEA. Similarly, the exposed photoresist layer became insoluble in PGMEA at a treatment temperature of about 170° C. to 175° C. for a heating time of 5 minutes.

The above results show that the solubility of the exposed photoresist layer can be significantly reduced using a thermal treatment of 1 and 5 minutes at temperatures ranging from 90° C. to 200° C. Appropriate temperature/time conditions can be determined where no thickness change occurs between the "After Bake" (circles in FIGS. 9A and 9B) and "PGMEA development" curves (triangles in FIGS. 9A and 9B). The optimal thermal treatment conditions for temperature and heating time can depend on a number of factors including the exposure dosage, the photoresist formulation, and the irradiation type (spectral bandwidth and intensity). In general, a thermal treatment at higher temperature allows for shorter heating times, whereas a longer heating time shifts the conditions to lower temperatures. These data are for bulk films and actual conditions necessary to render the photoresist insoluble in PGEMA may vary depending upon the size of the features being patterned; however, the thermal treatment results of Example 6 have, in general, been found to be predictive of the PGMEA solubility of a developed photoresist layer which has been given a post-development exposure and/or similar thermal treatment.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof, unless stated otherwise.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of forming a layered structure comprising a self-assembled material, the method comprising:
    disposing a photoresist layer comprising a non-crosslinking, positive-tone photoresist on a surface of a substrate; optionally baking the photoresist layer; pattern-wise exposing the photoresist layer to first radiation; optionally baking the exposed photoresist layer; developing the exposed photoresist layer with an aqueous alkaline developer to form an initial patterned photoresist layer comprising non-exposed photoresist;
    treating the initial patterned photoresist layer to a photochemical treatment and a thermal treatment, wherein the thermal treatment is performed at a temperature of 165° C. to 200° C. for at least 1 sec, thereby forming a treated patterned photoresist layer comprising non-crosslinked treated photoresist, wherein i) the treated photoresist is insoluble in a given organic solvent suitable for casting a given material capable of self-assembly, ii) the treated photoresist is soluble in the aqueous alkaline developer and/or a second organic solvent, and iii) the given organic solvent is selected from the group consisting of monoalcohols, glycols, glycol mono ethers, glycol mono ether esters, and combinations thereof;
    casting a solution comprising the given material capable of self-assembly dissolved in the given organic solvent on the treated patterned photoresist layer, and removing the given organic solvent; and
    allowing the casted given material to self-assemble while optionally heating and/or annealing the casted material, thereby forming the layered structure comprising the self-assembled material.

2. The method of claim 1, wherein the photochemical treatment comprises exposing the initial patterned photoresist layer to second radiation at a dose of 1 to 200 mJ/cm$^2$.

3. The method of claim 1, wherein the photochemical treatment comprises flood exposing the initial patterned photoresist layer with a broad band deep ultraviolet source at a dose of 1 to 200 mJ/cm$^2$.

4. The method of claim 1, wherein the photoresist is capable of chemical amplification.

5. The method of claim 1, wherein the self-assembled given material is disposed in a trench of the treated patterned photoresist layer, and the self-assembled given material has a thickness less than or equal to a height of the trench.

6. The method of claim 1 wherein the given organic solvent is selected from the group consisting of ethylene glycol, propylene glycol, propylene glycol monomethyl ether acetate (PGMEA), propylene glycol monomethyl ether (PGME), 4-methyl-2-pentanol, and combinations thereof.

7. The method of claim 1, further comprising selectively removing a first domain of the self-assembled given material, while leaving behind a second domain of the self-assembled given material, thereby forming a second layered structure comprising a relief pattern.

8. The method of claim 7, further comprising transferring the relief pattern to the substrate, thereby forming a third layered structure.

9. The method of claim 1, wherein the given material capable of self-assembly comprises a block polymer selected from the group consisting of poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-dimethylsiloxane), poly(styrene-b-ferrocenyldimethylsilane), poly(styrene-b-isoprene-b-ethylene oxide), poly(styrene-b-isoprene-b-methyl methacrylate), poly(styrene-b-ferrocendimethylsilane-b-isoprene), and a combination comprising at least one of the foregoing block copolymers.

10. The method of claim 1, wherein the given material capable of self-assembly comprises a polymer blend of two or more immiscible polymers.

11. The method of claim 1, wherein the photoresist is pattern-wise exposed using 193 nm immersion lithography.

12. The method of claim 1, wherein the first radiation is extreme ultraviolet or electron beam.

13. The method of claim 1, wherein the substrate comprises an anti-reflection layer, and the photoresist layer is disposed on the anti-reflection layer.

14. The method of claim 13, wherein the surface of the anti-reflection layer comprises a component selected from the group consisting of poly(styrene-co-epoxydicyclopentadiene methacrylate), poly(styrene-co-methyl methacrylate-co-expoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co vinyl benzocyclobutane, poly(alpha-methyl styrene-co-methyl methacrylate), poly(methyl glutarimide) (PMGI), self-assembled monolayers, hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate), and combinations thereof.

15. The method of claim 1, wherein the given organic solvent is propylene glycol monomethyl ether acetate (PGMEA).

16. A method of forming a layered structure comprising a relief pattern derived from a self-assembled material, the method comprising:
disposing a photoresist layer comprising a non-crosslinking, positive-tone photoresist capable of chemical amplification on a surface of a substrate; pattern-wise exposing the photoresist layer to first radiation and optionally baking the exposed photoresist layer; developing the exposed photoresist layer with an aqueous alkaline developer to form an initial patterned photoresist layer comprising non-exposed photoresist;
flood exposing the initial patterned photoresist layer to second radiation at a dose of 1 to 200 $mJ/cm^2$, and heating the flood exposed initial patterned photoresist layer at a temperature of 165° C. to 200° C. for at least 1 sec, thereby forming a treated patterned photoresist layer comprising non-crosslinked treated photoresist, wherein i) the treated photoresist is insoluble in a given organic solvent suitable for casting a given material capable of self-assembly, ii) the treated photoresist is soluble in the aqueous alkaline developer and/or a second organic solvent, and iii) the given organic solvent is selected from the group consisting of monoalcohols, glycols, glycol mono ethers, glycol mono ether esters, and combinations thereof;
casting a solution comprising the given material capable of self-assembly dissolved in the given organic solvent on the treated patterned photoresist layer, and removing the given organic solvent;
allowing the casted given material to self-assemble while optionally heating and/or annealing the casted given material, thereby forming a domain pattern comprising the self-assembled given material;
selectively removing a first domain of the domain pattern, while leaving behind a second domain of the domain pattern, thereby forming the layered structure comprising the relief pattern.

17. The method of claim 16, wherein the given organic solvent is selected from the group consisting of ethylene glycol, propylene glycol, propylene glycol monomethyl ether acetate (PGMEA), propylene glycol monomethyl ether (PGME), 4-methyl-2-pentanol, and combinations thereof.

18. The method of claim 16, further comprising removing the treated photoresist with an aqueous alkaline developer after selectively removing the first domain.

19. The method of claim 16, wherein the relief pattern has a higher spatial frequency than the treated patterned photoresist layer.

20. A method for forming a layered structure from a self-assembled polymer, comprising:
forming a layer of a non-crosslinking, positive-tone photoresist on a substrate that includes a surface suitable for self-assembly of a polymer, the photoresist capable of chemical amplification; pattern-wise exposing the photoresist; optionally baking the exposed photoresist; developing the exposed photoresist in an aqueous alkaline developer to form a non-crosslinked initial patterned photoresist layer (initial layer) comprising non-exposed photoresist;
generating polar groups in the initial patterned photoresist layer by giving the initial layer a) a flood exposure to radiation; b) a post-exposure bake, and c) a heat treatment at a temperature of 170° C. to 185° C. for at least 2 minutes, thereby forming a treated patterned photoresist layer comprising non-crosslinked treated photoresist, wherein i) the treated photoresist is soluble in an aqueous alkaline developer and/or a second organic solvent, ii) the treated photoresist is insoluble in a given organic solvent suitable for casting a given material capable of self-assembly, and iii) the given organic solvent is selected from the group consisting of monoalcohols, glycols, glycol mono ethers, glycol mono ether esters, and combinations thereof;
optionally, further thermally or chemically treating the treated photoresist layer;
applying a layer of a self-assembling polymer dissolved in the given casting solvent over the non-crosslinked treated photoresist layer, and allowing the self-assembling polymer to self-assemble;
optionally, annealing the layer of self-assembling polymer;
selectively removing a specific self-assembled domain of the self-assembled polymer, thereby forming a relief pattern;
selectively removing the non-crosslinked treated photoresist layer using a stripper and/or plasma; and
optionally, transferring the relief pattern to the substrate.

21. The method of claim 20, wherein the polar groups are generated by exposing the initial patterned photoresist layer with ultraviolet radiation to form an acid from a photoacid generator, wherein the photoacid generator catalyzes the acidolysis of protected polar groups.

22. The method of claim 20, wherein the polar groups are generated by thermolysis of protected polar groups.

23. The method of claim 20, wherein the polar groups are generated by thermolysis of a thermal acid generator or photoacid generator molecule to form an acid that catalyzes the acidolysis of protected polar groups.

24. The method of claim 20, wherein the polar groups include at least one of the following: carboxylic acids, phenols, higher aromatic alcohols, and alcohols.

* * * * *